(12) United States Patent
De Boer et al.

(10) Patent No.: US 10,054,863 B2
(45) Date of Patent: Aug. 21, 2018

(54) METHOD OF DETERMINING A POSITION OF A SUBSTRATE IN A LITHOGRAPHY SYSTEM, SUBSTRATE FOR USE IN SUCH A METHOD, AND LITHOGRAPHY SYSTEM FOR CARRYING OUT SUCH METHOD

(71) Applicant: MAPPER LITHOGRAPHY IP B.V., Delft (NL)

(72) Inventors: Guido De Boer, Leerdam, NC (US); Niels Vergeer, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 322 days.

(21) Appl. No.: 14/630,678

(22) Filed: Feb. 25, 2015

(65) Prior Publication Data
US 2015/0177625 A1    Jun. 25, 2015

Related U.S. Application Data

(63) Continuation of application No. PCT/EP2013/072518, filed on Oct. 28, 2013.
(Continued)

(51) Int. Cl.
*G03F 9/00* (2006.01)
*B82Y 40/00* (2011.01)
(Continued)

(52) U.S. Cl.
CPC ............ *G03F 9/7076* (2013.01); *B82Y 10/00* (2013.01); *B82Y 40/00* (2013.01); *G03F 9/7046* (2013.01);
(Continued)

(58) Field of Classification Search
CPC ................ B82Y 10/00; G03F 7/70141; G03F 2009/005; G03F 9/7003; G03F 9/7007;
(Continued)

(56) References Cited

U.S. PATENT DOCUMENTS 4,631,416 A  12/1986 Trutna et al.
4,967,088 A  10/1990 Stengl et al.
(Continued)

FOREIGN PATENT DOCUMENTS

EP    1111473 A2   6/2001
EP    1184896 A1   3/2002
(Continued)

OTHER PUBLICATIONS

Dr. Lynn Fuller, 'Wafer Alignment for Canon Stepper', Rochester Institute of Technology Microelectronic Engineering, Jan. 14, 2008.
(Continued)

*Primary Examiner* — Gordon J Stock, Jr.
(74) *Attorney, Agent, or Firm* — Hoyng Rokh Monegier LLP; David P. Owen

(57) ABSTRACT

The invention relates to a substrate comprising an optical position mark for being read-out by an optical recording head for emitting light of predetermined wavelength, preferably red or infra-red light, more in particular of 635 nm light, the optical position mark having a mark height, a mark length and a predetermined known position on the substrate, the optical position mark extending along a longitudinal direction and being arranged for varying a reflection coefficient of the position mark along said longitudinal direction, wherein the optical position mark comprises:
   a first region having a first reflection coefficient and a first width;
   a second region neighboring the first region and forming a first region pair, the second region having a second reflection coefficient and a second width, and the second reflection coefficient being different from the first reflection coefficient, wherein the first region comprises sub-wavelength structures in comparison with a wavelength of the predetermined wavelength light.

28 Claims, 19 Drawing Sheets

Related U.S. Application Data

(60) Provisional application No. 61/718,872, filed on Oct. 26, 2012, provisional application No. 61/732,445, filed on Dec. 3, 2012.

(51) Int. Cl.
*H01J 37/317* (2006.01)
*H01J 37/04* (2006.01)
*B82Y 10/00* (2011.01)
*H01J 37/304* (2006.01)

(52) U.S. Cl.
CPC ........ *G03F 9/7084* (2013.01); *H01J 37/3045* (2013.01); *H01J 37/3174* (2013.01)

(58) Field of Classification Search
CPC .... G03F 9/7011; G03F 9/7015; G03F 9/7019; G03F 9/7023; G03F 9/7026; G03F 9/703; G03F 9/7034; G03F 9/7038; G03F 9/7042; G03F 9/7046; G03F 9/7065; G03F 9/7069; G03F 9/7073; G03F 9/7084; G03F 9/7088; G03F 9/7092; H01J 37/3045; H01J 37/3174; H01L 23/544; H01L 2223/544; H01L 2223/54426; H01L 2223/54453; H01L 2223/5446; H01L 2223/54466; H01L 2223/54473; H01L 2223/5448
See application file for complete search history.

(56) References Cited

U.S. PATENT DOCUMENTS

| | | | |
|---|---|---|---|
| 5,523,193 A | 6/1996 | Nelson | |
| 5,557,411 A | 9/1996 | Houryu | |
| 5,827,629 A | 10/1998 | Miyatake | |
| 6,108,089 A | 8/2000 | Shiraishi | |
| 6,992,766 B2 | 1/2006 | Tanaka et al. | |
| 7,116,626 B1 | 10/2006 | Woods et al. | |
| 7,418,125 B2 | 8/2008 | Miyashita | |
| 7,466,414 B2 | 12/2008 | Tanaka et al. | |
| 7,586,202 B2 * | 9/2009 | Hoshi | H01L 23/544 |
| | | | 257/797 |
| 7,626,701 B2 * | 12/2009 | Van Bilsen | G03F 9/7003 |
| | | | 356/401 |
| 9,395,635 B2 * | 7/2016 | De Boer | G03F 9/7076 |
| 2003/0174330 A1 | 9/2003 | Tanaka et al. | |
| 2004/0114143 A1 * | 6/2004 | Van Haren | G03F 9/7046 |
| | | | 356/401 |
| 2005/0069790 A1 | 3/2005 | Gruss et al. | |
| 2006/0061743 A1 | 3/2006 | Den Boef et al. | |
| 2006/0103845 A1 | 5/2006 | Tanaka et al. | |
| 2006/0139642 A1 | 6/2006 | Van Bilsen | |
| 2006/0279735 A1 * | 12/2006 | Van Haren | G03F 9/7076 |
| | | | 356/401 |
| 2007/0114678 A1 * | 5/2007 | Van Haren | G03F 9/7049 |
| | | | 257/797 |
| 2008/0079920 A1 | 4/2008 | Hommen et al. | |
| 2009/0310113 A1 | 12/2009 | Musa et al. | |
| 2010/0123886 A1 * | 5/2010 | Bijnen | G03F 9/7003 |
| | | | 355/53 |
| 2012/0229786 A1 | 9/2012 | Engelen et al. | |
| 2012/0267802 A1 | 10/2012 | de Boer et al. | |
| 2012/0268724 A1 * | 10/2012 | De Boer | G03F 9/7088 |
| | | | 355/71 |
| 2012/0268725 A1 * | 10/2012 | De Boer | G03F 9/7088 |
| | | | 355/72 |
| 2013/0021593 A1 | 1/2013 | Onvlee et al. | |

FOREIGN PATENT DOCUMENTS

| | | |
|---|---|---|
| EP | 2204697 A3 | 7/2010 |
| JP | 07-248208 | 9/1995 |
| JP | 2003 338455 A | 11/2003 |
| JP | 2008 211265 A | 9/2008 |
| JP | 2011 155300 A | 8/2011 |

OTHER PUBLICATIONS

Dr. Lynn Fuller et al. "Introduction to ASML PAS 5500 Wafer Alignment and Exposure", Rochester Institute of Technology Microelectronic Engineering, Oct. 10, 2011.
Wang Tao et al."Novel fast and accurate correlation-tracking algorithm", National Air Intelligence Center, Oct. 8, 1996.
MEMSnet Lithography, Oct. 17, 2012.
"Technology Used in Semiconductor Lithography Equipment", 1 page, Canon technology, 2012.
"Pattern Recognition, Find a Mark in an Image", Victor image processing, Catenary sys. Inc. Feb. 14, 2013.
Vijayakumar Bhagavatula, "Correlation Filters for Face Recognition", Electrical & Computer Engineering, Feb. 2006.
Qi Tian et al, "Algorithms for subpixel registration", Computer vision, graphics and Image Processing vol. 35, pp. 220-233, Mar. 27, 1986.
Henry Megens et al. "Advances in Process Overlay—Alignment Solutions for Future Technology Nodes;", ASML, Veldhoven; Proc. of SPIE vol. 6518, 6518 IZ-1 t/m Z-12 (2007).

* cited by examiner

METHOD OF DETERMINING A POSITION OF A SUBSTRATE IN A LITHOGRAPHY SYSTEM, SUBSTRATE FOR USE IN SUCH A METHOD, AND LITHOGRAPHY SYSTEM FOR CARRYING OUT SUCH METHOD

FIELD OF THE INVENTION

The present invention relates to method of determining a position of a substrate in a lithography system, the system comprising an optical alignment sensor for emitting a light beam to the substrate and for measuring an intensity profile of a zero-th order reflected light beam. The invention also relates to an optical position mark for use in such method. The invention further relates to a lithography system for processing a substrate and being configured for carrying out such method.

BACKGROUND OF THE INVENTION

Position determination in lithography systems is generally known, normally using detection of light reflected in several diffraction orders, as is described for instance in U.S. Pat. No. 4,967,088. A disadvantage of determining a position using light reflected in several diffraction orders is that the light detectors for the different diffraction orders have to be accurately positioned in the system, thus increasing the cost of the system. Moreover, such systems are sensitive to slight errors in focus of the light beam or tilt of a substrate relative to the light beam.

U.S. Pat. No. 5,827,629 discloses a similar system, wherein a wafer with an exposure surface and an exposure mask are disposed. The exposure surface is directed to the exposure mask with a gap being interposed therebetween. The wafer has a position aligning wafer mark formed on the exposure surface. The wafer mark has a linear or point scattering source for scattering incident light, and the exposure mask has a position aligning mask mark having a linear or point scattering source for scattering incident light. A relative position of the wafer and exposure mask is detected by applying illumination light to the wafer mark and mask mark and by observing scattered light from the scattered sources of the wafer mark and mask mark. In order to at least partially overcome the problems of the above-mentioned prior-art, it has been suggested by the inventors to provide a substrate comprising a checkerboard pattern of reflective squares, having a maximum reflection coefficient, and non-reflective squares, having a minimum reflection coefficient, wherein said squares have a width corresponding to a diameter of a cross-section of a light beam projected on said pattern. By measuring a reflected zero-th order intensity of the beam, a change in position of the beam relative to the substrate can be determined without measuring multiple diffraction orders. Ideally, when the beam spot of the light beam is moved over the pattern, the intensity of the reflected signal is a sinusoidal function with high contrast of the position of the beam spot on the pattern. However, in practice the intensity distribution of the beam spot generally does not correspond to a homogeneous and sharply cut-off disc-like profile but instead follows a Gaussian profile, the resulting reflected intensity signal does not closely resemble a sinusoid function as a function of the position of the beam on the substrate. As a result, the determination of the position of the beam spot on the substrate based on the intensity of the reflected beam is less accurate.

U.S. Pat. No. 7,418,125 B2 discloses an apparatus for detecting a position of a region, corresponding to a mark, in image data, as a mark position, the mark including periodically arranged patterns. A first unit obtains a real-space energy distribution which corresponds to an energy spectrum distribution of each partial area of the image data. A probability distribution obtaining unit obtains a probability distribution based on the real-space energy distribution, the probability distribution indicating repetitive positions of the periodically arranged patterns and the intensity of periodicity at this position. A second unit obtains a degree of correlation between each probability distribution obtained by the probability distribution obtaining unit and a pre-registered probability distribution of the mark, and a third unit obtains the mark position based upon the degrees of correlation obtained by the second unit.

All of the above-mentioned methods of determining a position of a substrate in a lithography system are cumbersome, complex, and suffer from draw-backs, such as inaccuracy.

SUMMARY OF THE INVENTION

It is an object of the present invention to provide a method of determining a position of a substrate in a lithography system, which is simple and provides a very high accuracy (including a high reproducibility and repeatability).

It is a further object of the invention to provide an optical position mark for use in such method, and a lithography system configured for carrying out such method.

The invention is defined by the independent claims. The dependent claims define advantageous embodiments.

To this end, according to a first aspect, the present invention provides a substrate comprising an optical position mark for being read-out by an optical recording head for emitting light, preferably red or infra-red light, the optical position mark having a mark height, a mark length and a predetermined known position on the substrate, the optical position mark extending along a longitudinal direction and being arranged for varying a reflection coefficient of the position mark along said longitudinal direction, wherein the optical position mark comprises:

a first region having a first reflection coefficient and a first width;

a second region neighboring the first region and forming a first region pair, the second region having a second reflection coefficient and a second width, the first width being equal to the second width measured in the longitudinal direction, and the second reflection coefficient being different from the first reflection coefficient, wherein the first region comprises sub-wavelength structures in comparison with a wavelength of the light, such as 635 nm.

The advantage of the substrate of the invention is that the provision of sub-wavelength structures in the first region increases process tolerance of the position mark. This may be understood as follows. The sub-wavelength structures may be made using conventional lithography or processing techniques. Assuming that one of said sub-wavelength structures is not correctly manufactured or may be even absent, the mark may still be used without loosing too much accuracy. A second effect is that sub wavelength features cause less sensitivity to height variations in the optical position mark when used in the invention. Furthermore, the substrate according to the invention has an extremely regular structure, i.e one width and one spacing throughout the position mark. Such large regularity results in a position mark, which is much easier to design and the risk of design errors is thereby strongly reduced (expressed differently, the chance that a simple optical position mark is designed wrong is much lower than that of complex optical position marks). Furthermore the verifiability is much higher of such design. Consequently, the systematical reproducibility is much better using segmented mark design as prescribed in the invention.

In an embodiment the first width is equal to the second width measured in the longitudinal direction. Such structure provides for an even larger regularity.

In an embodiment the sub-wavelength structures comprise a plurality of regular stripe-shaped segments extending in a further direction perpendicular to the longitudinal direction, wherein each regular segment is formed by a first sub-region and a second sub-region. This is a first variant of making regular sub-wavelength structures, and experiments have shown that the results with these marks are very good.

In an embodiment the sub-wavelength structures comprise a plurality of regular stripe-shaped segments extending in the longitudinal direction, wherein each regular stripe-shaped segment is formed by a first sub-region and a second sub-region. This is a second variant of making regular sub-wavelength structures, and experiments have shown that the results with these marks are very good, and even slightly better than the first variant.

An embodiment further comprises a plurality of additional region pairs, wherein each additional region pair is substantially equal to the first region pair. The regularity of such structure is very advantageous as discussed before. Moreover, the more region pairs the more features. This is advantageous in case cross-correlation is used for measuring the displacement of the position mark with regards to the expected position (i.e. by comparing a measured intensity graph with an expected intensity graph).

In an embodiment the first width and the second width are in a range between 1 μm and 2 μm. The advantage of this range is that it is larger than a spot size of a conventional optical read head, which is typically in the range of 1 μm to 2 μm. The effect is that the contrast in reflected beam intensity between the first and second region is higher.

In an embodiment the mark length is at least 100 μm. The longer the mark length the more accurate the mark position may be determined using cross-correlation measurement, i.e. cross-correlating a larger region results in a higher peak in the cross-correlation curve.

In an embodiment the sub-wavelength structures provide for the first reflection coefficient being lower than the second reflection coefficient. The sub-wavelength structures in this embodiment effectively absorb the light beam from the optical read head, which severely reduces the reflection coefficient of the first region.

In an embodiment the first region pair and the plurality of additional region pairs form a first main region. The substrate further comprises a second main region neighboring the first main region, wherein the second main region is substantially free of structures. The addition of the second main region that is substantially free of structures increases the process tolerance of the optical position mark and improves the cross-correlation measurement, i.e. the cross-correlation function shows a higher and sharper peak.

In an embodiment a third main region neighboring the second main region, wherein the second main region is embedded between the first main region and the third main region when viewed in the longitudinal direction. The advantage of this embodiment is that the position mark may be very easily detected optically, due to the two separated regions. This enables a quick estimation of the position of the optical position mark when using a microscope, for example.

In an embodiment the third main region is build up in a similar manner as the first region comprising sub-wavelength structures. This embodiment provides for a larger regularity and is thereby less process-dependent, and has a larger verifiability.

In an embodiment the first main region and the third main region are substantially identical. This embodiment provides for an even larger regularity and is thereby less process-dependent, and has an even larger verifiability.

In an embodiment the first main region and the third main region are different (length, pitch, number of structures, etc). Making the first and third main region different from each other provides additional information, namely the orientation of the mark in comparison with the scan direction of the optical head, i.e. left and right side are distinguishable.

An embodiment further comprises a first end region located at a first end of the optical position mark neighboring the first main region, the first end region being substantially free of structures. The addition of an end region that is substantially free of structures increases the process tolerance of the optical position mark and improves the cross-correlation measurement, i.e. the cross-correlation function shows a higher and sharper peak.

In an embodiment further comprises a second end region located at a second end of the optical position mark neighboring the third main region, the second end region being substantially free of structures. The addition of an end region that is substantially free of structures increases the process tolerance of the optical position mark and improves the cross-correlation measurement, i.e. the cross-correlation function shows a higher and sharper peak.

In an embodiment the mark height is a plurality of times the wavelength of the red or infra-red light. In an embodiment the mark height is larger as possible to provide for the highest tolerance to position errors in that direction. However, the mark height is preferably smaller than 40 μm such that it fits within a scribe line, which typically has such width.

To this end, according to a second aspect, the present invention provides a lithography system for processing a substrate according to the invention as defined in claims 1 to 14, the system comprising:

a substrate exposure means for exposing the substrate;
a substrate carrier for receiving said substrate, wherein the substrate carrier is movable with respect to the substrate exposure means for allowing exposure of different parts of said substrate, and
an optical alignment sensor mounted to the system such that it has a substantially constant distance from the substrate exposure means, the optical alignment sensor being configured for emitting a light beam to the substrate and for measuring an intensity profile of a zero-th order reflected light beam,
wherein the lithography system is configured for carrying out the method of the invention as defined in claims 22 to 31.

The lithography system of the invention makes use of measuring an intensity of a zero-th order reflected light beam, in contrast to the first and higher-order measurements known from the prior art. The system of the invention may be conveniently used with the substrate of the invention. Whereas in the prior art solutions some sort of linear or sinusoidal varying of the intensity of the reflected light beam is required in the invention no such requirement is there at all. As will be explained with regards to the method of the invention, the invention only requires a varying reflectivity resulting in varying intensity of the reflected beam. Once the intensity graph of the position mark is known, the only thing that is required in the invention is to compare a measured intensity graph with the known intensity graph to determine the actual position of the optical position mark.

In an embodiment the system further comprises a further optical alignment sensor mounted to the system such that it has a further substantially constant distance from the substrate exposure means, the optical alignment sensor being configured for emitting a further light beam to the substrate and for measuring an intensity profile of a zero-th order reflected light beam, the lithography system being configured for allowing said optical alignment sensor scanning in a first direction, and the lithography system being configured for allowing said further optical alignment sensor scanning in a second direction orthogonal to said first direction. This embodiment provides a second alignment sensor in the system and dedicates each of said sensors for scanning a specific one of said directions. The advantage is that each of said sensors only determines one coordinate and provides a tolerance for the other coordinate (not being measured) at the same time (due to the fact that the 1-D optical position mark extends in a longitudinal direction only, i.e. the other dimension provides a position tolerance at the same time).

In an embodiment the first direction coincides with a first movement direction of the substrate in operational use of the lithography system, and the second direction coincides with a second movement direction of the substrate in operational use of the lithography system. Such division of the measurements over both optical alignment sensors is particularly advantageous in case both alignment sensors are positioned on orthogonal axis that cross in a center of the substrate exposure system.

An embodiment comprises a driver stage for moving and positioning said substrate carrier with respect to the substrate exposure means. The driver stage effectively completes the lithography system, which may be a photolithography system, an E-beam lithography system, and an ion-beam lithography system.

In an embodiment the substrate exposure means comprises an optical column adapted for projecting one or more exposure beams on the substrate, wherein said alignment sensors are mounted to the optical column.

In an embodiment the optical column is configured for projecting a multitude of charged particle exposure beams, such as electron beams, on the substrate.

To this end, according to a third aspect, the present invention provides a method of determining a position of a substrate in a lithography system, the system comprising an optical alignment sensor for emitting a light beam to the substrate and for measuring an intensity profile of a zero-th order reflected light beam. The method comprises:

providing a substrate comprising an optical position mark having a mark width, a mark length and a predetermined known position on the substrate, the optical position mark extending along a longitudinal direction and being arranged for varying a reflection coefficient of the position mark along said longitudinal direction;

moving the substrate such that the optical position mark is substantially near the optical alignment sensor in accordance with an estimated position of the optical position mark with regards to the optical alignment sensor;

scanning the optical position mark along a scan path in the longitudinal direction with the optical alignment sensor to obtain a measured intensity profile having a scan length, wherein the scan length is longer than the mark length;

comparing the measured intensity profile with an expected intensity profile associated with the optical position mark to determine a difference between an actual position of the optical position mark and the estimated position, and determining the actual position of the position mark from the scan path and said difference.

The method provides a quick and efficient way of determining the position of the substrate (one coordinate is determined, for example an x-coordinate or a y-coordinate). In lithography systems interferometers may be used to determine a position of a chuck or a substrate on the chuck with respect to the projection optics. Furthermore the lithography system is provided with at least one optical alignment sensor, wherein, in the current method, this optical alignment sensor preferably has a constant and known distance with respect to the substrate exposure means in a lithography system. Once the optical position marker is known, an intensity profile can be measured or simulated of this marker, which provides the expected intensity profile. An interesting aspect of this method is that the position of the substrate relative to the optical alignment sensor at first only needs to be estimated, i.e. needs to be known with a limited accuracy, for instance ±20 µm. The tolerance for this inaccuracy is mainly determined by the mark width in the transversal direction. Using this estimated position the substrate is moved such that the optical position mark is substantially near the optical alignment sensor. The optical alignment sensor subsequently scans the optical position mark with a scan length longer than the mark length to obtain a measured intensity profile. The latter creates the tolerance for the inaccuracy of the estimated position in the longitudinal direction. In a next step the measured intensity profile is compared with the expected intensity profile. In most cases the measured intensity profile will be to some extent a shifted (but maybe somewhat deformed) version of the expected intensity profile, wherein the shift is indicative for the actual position of the optical position mark relative to the optical alignment sensor. This shift combined with a start location of the scan provides the actual position of one end of the position mark. In embodiments a position of a center of the optical position mark will be considered to be the position of the optical position mark.

Non-published international application WO 2012/144904 describes a substrate for use in a lithography system. Said substrate is provided with an at least partially reflective position mark comprising an array of structures. The array extends along a longitudinal direction of the mark. Said structures are arranged for varying a reflection coefficient of the mark along the longitudinal direction, wherein said reflection coefficient is determined for a predetermined wavelength. The present application provides an improvement on WO 2012/144904.

In an embodiment of the method the step of comparing of the measured intensity profile with the expected intensity profile comprises:

calculating a cross-correlation function between said profiles, and determining a location of a maximum in said cross-correlation function, wherein said location is indicative for said difference. A first advantage of this embodiment is that it is much more marker tolerant as long as the marker is known as well as the expected intensity profile associated with this marker. Even a simple marker in accordance with the invention may be used, whereas in prior art solution much more requirements exist for the marker. Moreover, the method is more tolerant for the accuracy of the expected intensity profile. Cross-correlation is a very advantageous method of determining a shift between said intensity profiles, particularly when there is large "deformation" or mismatch of the intensity profile, when comparing the expected intensity profile with the measured intensity profile.

In an embodiment of the method, in the step of providing the substrate, the substrate comprises a further optical position mark having a further mark width, a further mark length and a further predetermined known position on the substrate, the further optical position mark extending along a further longitudinal direction and being arranged for varying a further reflection coefficient of the further position mark along said further longitudinal direction, wherein said further longitudinal direction is orthogonal to said longitudinal direction, wherein the optical position mark and the further optical position mark form a position mark couple the method further comprising, after the step of scanning the optical position mark, steps of:

moving the substrate such that the further optical position mark is substantially near the optical alignment sensor in accordance with a further estimated position of the further optical position mark with regards to the optical alignment sensor;

scanning the further optical position mark along a further scan path in the further longitudinal direction with the optical alignment sensor to obtain a further measured intensity profile having a further scan length, wherein the further scan length is longer than the further mark length;

comparing the further measured intensity profile with a further expected intensity profile associated with the further optical position mark to determine a further difference between a further actual position of the further optical position mark and the further estimated position, and determining the further actual position of the further position mark from the further scan path and said further difference. As the optical position mark in accordance with the invention only provides one coordinate of the optical position mark (namely on a first axis extending in the longitudinal direction of the optical position mark). This embodiment provides the second coordinate of the position, the second coordinate corresponding to an axis in a second direction orthogonal to a first axis of the first coordinate.

In an embodiment of the method the step of comparing of the further measured intensity profile with the further expected intensity profile comprises:

calculating a further cross-correlation function between said profiles, and determining a further location of a maximum in said further cross-correlation function, wherein said further location is indicative for said difference. A first advantage of this embodiment is that it is much more marker tolerant as long as the marker is known as well as the expected intensity profile associated with this marker. Even a simple marker in accordance with the invention may be used, whereas in prior art solution much more requirements exist for the marker. Moreover, the method is more tolerant for the accuracy of the expected intensity profile. Cross-correlation is a very advantageous method of determining a shift between said intensity profiles, particularly when there is large "deformation" or mismatch of the intensity profile, when comparing the expected intensity profile with the measured intensity profile.

In an embodiment of the method the lithography system comprises a further optical alignment sensor for emitting a further light beam to the substrate and for measuring an intensity profile of a zero-th order reflected light beam, the lithography system being configured for allowing said optical alignment sensor scanning only in a first direction, and the lithography system being configured for allowing said further optical alignment sensor scanning only in a second direction orthogonal to said first direction, wherein, in the step of providing the substrate the longitudinal direction of the optical position mark coincides with the first direction and the further longitudinal direction of the further optical position mark coincides with the second direction, wherein, in the respective steps of scanning, the optical alignment sensor is used for scanning the optical position mark and the further optical alignment sensor is used for scanning the further optical position mark. The advantage is that each of said sensors only determines one coordinate and provides a tolerance for the other coordinate (not being measured) at the same time (due to the fact that the 1-D optical position mark extends in a longitudinal direction only, i.e. the other dimension provides a position tolerance at the same time).

In an embodiment of the method the first direction coincides with a first movement direction of the substrate in operational use of the lithography system, and the second direction coincides with a second movement direction of the substrate in operational use of the lithography system. Such division of the measurements over both optical alignment sensors is particularly advantageous in case both alignment sensors are positioned on orthogonal axis that cross in a center of the substrate exposure system.

In an embodiment of the method, in the step of providing the substrate, the substrate comprises a second optical position mark couple being located at a different location on the substrate, wherein the second optical position mark couple is similar to a first optical position mark couple, and wherein the method is repeated for said second optical position mark couple. This embodiment enables measurement of rotational orientation of the substrate.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

Figure 1:
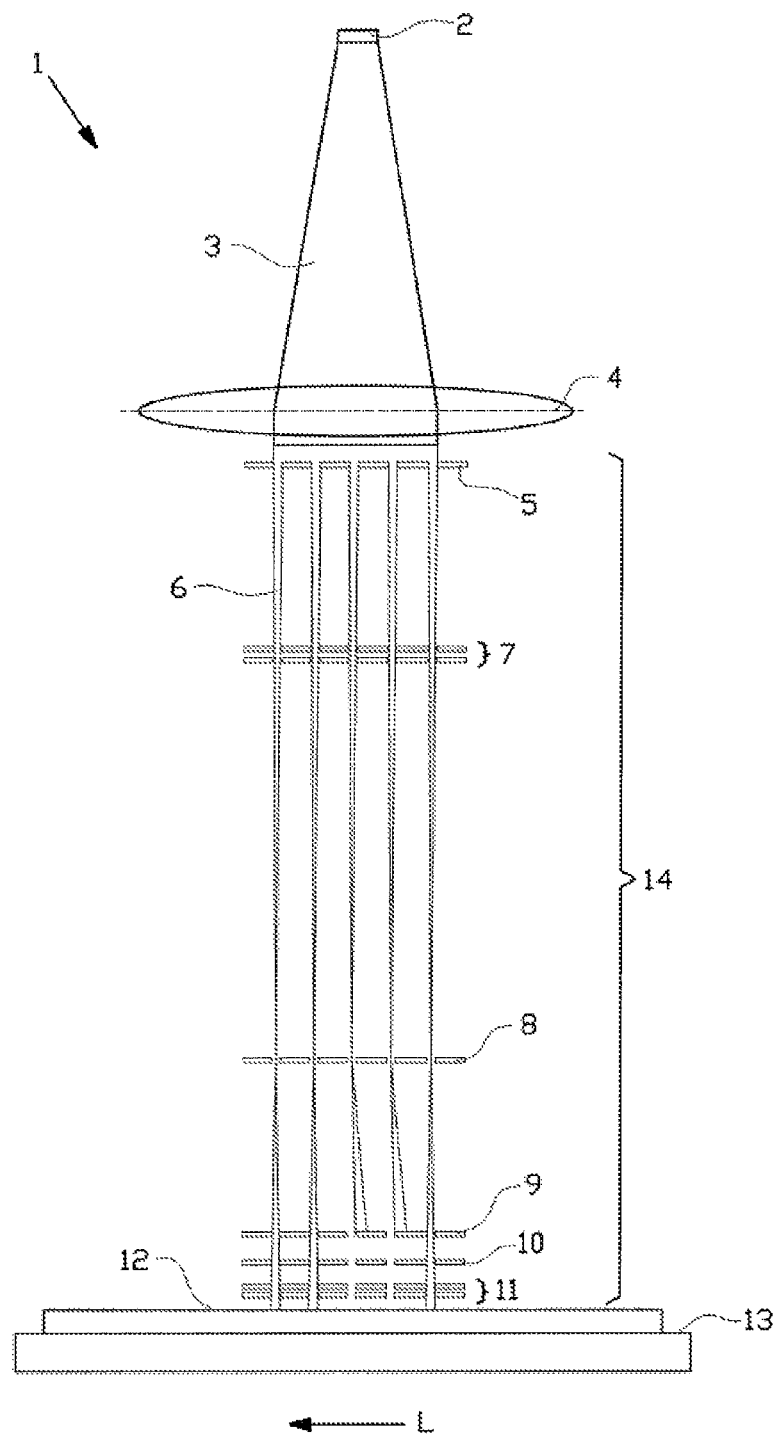
FIG. 1 shows a prior art lithography system in which the substrate according to the invention may be used.

LIST OF REFERENCE NUMERALS 2 source
3 charged particle beam
4 collimator
5 aperture array
6 multitude of charged particle beamlets
7 condenser array
8 beam blanker array
9 beam stop array
10 scanning deflector
11 focusing lens array
12 target (i.e. wafer)
13 moveable target carrier
14 optical column
L long-stroke direction
S short-stroke direction
15,16 straight edges or mirrors
21a,21b, 23a,23b one or more beams
20,22 interferometers
P1, P2, P3 respective points of the target
500 position device
550 beam spot
513 substrate (=target 12)
571 beam absorbing structures
511 light beam
536 beam splitter
512 focusing lens
519 beam intensity detector (photodiode)
560 graph
531 beam source
534 laser
532 optical fiber
533 optical system
535 collimator lens
518 reflected beam
536' polarizing beam splitter
511' polarized light beam
538 polarizer
539 quarter wave plate
PO projection optics
SMRK first position mark (for measuring one coordinate only)
DMRK second position mark (for measuring one coordinate only)
Xw x-coordinate of substrate
Yw y-coordinate of substrate
SS first optical alignment sensor
DS second optical alignment sensor
OO center of projection optics (origin)
Rz angular error of the chuck around z-axis
LN lane
I light intensity
CRC cross-correlation coefficient
TPR top region of cross-correlation curve
100 optical position mark
101 first region having first reflectivity
102 second region having second reflectivity
105 region pairs
110 first main region
120 second main region
130 third main region
140 end regions
ML mark length
MH mark height
W width of first region
SWS sub-wavelength structures
PSW pitch sub-wavelength structures
P pitch of region pair
100-1 optical position mark without sub-wavelength structures
100-2 optical position mark with sub-wavelength structures having longitudinal segmentation
100-3 optical position mark with sub-wavelength structures having transversal segmentation
WFR1 first wafer (substrate) having no masking layer stack
WFR2 second wafer (substrate) having thin masking layer stack
WFR3 third wafer (substrate) having thicker masking layer stack
WFR4 fourth wafer (substrate) having even thicker masking layer stack
WFR5 fifth wafer (substrate) having thickest masking layer stack
MRK1 first optical position mark (pitch 1 µm, non-segmented)
MRK2 second optical position mark (pitch 2 µm, non-segmented)
MRK3 third optical position mark (pitch 3 µm, non-segmented)
MRK4 fourth optical position mark (pitch 4 µm, non-segmented)
MRK5 fifth optical position mark (pitch 2 µm, longitudinally segmented)

MRK6 sixth optical position mark (pitch 2 μm, transversally segmented)

MRK7 seventh optical position mark (pitch 2 μm, segmented both longitudinally and transversally)

DETAILED DESCRIPTION OF THE INVENTION

A known lithography system is shown in FIG. 1. The lithography system 1 comprises a charged particle beam source 2 which emits a charged particle beam 3. Charged particle beam 3 traverses a collimator 4 before impinging on an aperture array 5. The aperture array splits the beam into a multitude of charged particle beamlets 6 which are condensed by condenser array 7. At beam blanker array 8 individual beamlets may be blanked, i.e. may be individually deflected such that they encounter beam stop array 9 later on in their trajectories instead of passing through apertures in beam stop array 9. The beamlets that have not been blanked then pass through a scanning deflector 10 which is adapted to provide a scanning deflection of said beamlets. At the end of their trajectories the beamlets that have not been blanked pass through a focusing lens array 11 adapted for focusing said beamlets onto a surface of a target 12, for instance a wafer. The target is placed on a moveable target carrier 13, adapted for displacing the target relative to optical column 14 along a long-stroke direction L, using a long-stroke actuator. The target carrier is further adapted for displacing the target along a short-stroke direction S by means of a short-stroke actuator. The short-stroke actuator may further comprise a 6 degree of freedom actuator, for fine tuning translation of the target in three orthogonal directions, and for fine tuning rotation of the target along three orthogonal axes. Typically a target 12 is exposed in a strip-by-strip fashion by moving the target under the optical column 14 using the long stroke actuator while exposing the target 12 to beamlets that may be deflected along the width of a strip along the short-stroke direction by the scanning deflector 10. When an entire strip has thus been patterned, the short stroke actuator may be used to displace target a distance corresponding to the width of the strip in the S direction, and the next strip may be processed.

When structures span more than one strip, or when a strip of the target is to be processed in multiple passes, for instance when patterning different layers of a semiconductor device, it is essential that the overlain layers can be aligned to within a specified accuracy. Such alignment may be achieved by accurately positioning the target 12 relative to the optical column 14.

Figure 2:
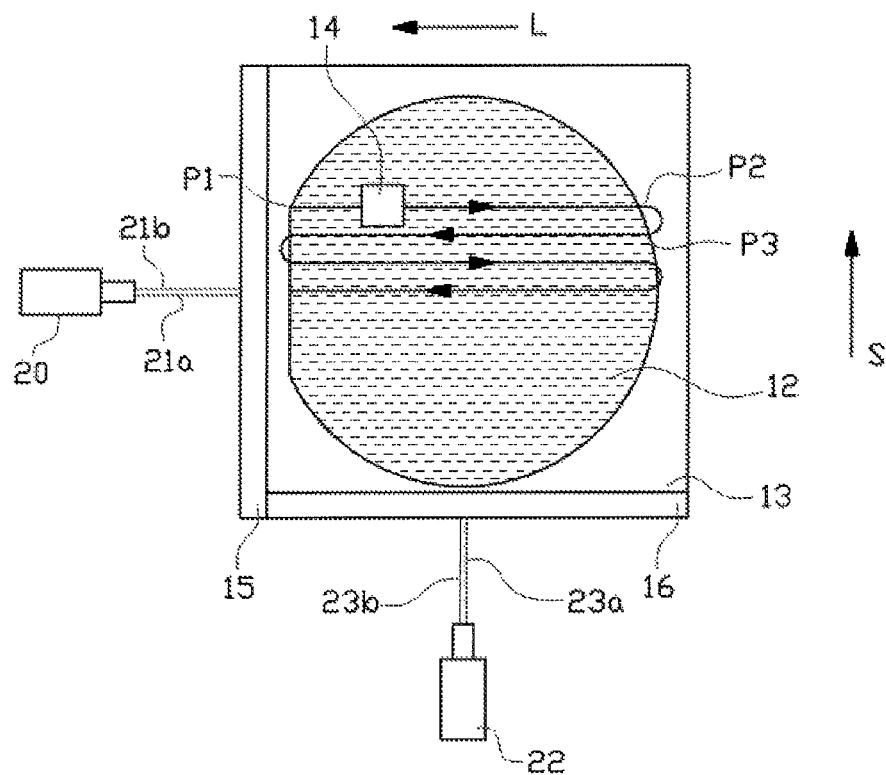
FIG. 2 shows a prior art positioning system, for determining a position of a target relative to an optical column, FIG. 3 schematically shows a position device adapted for providing a beam for cooperation with a substrate according to the invention, and for detecting an intensity of a reflection of said beam in said substrate.

FIG. 2 shows a schematic top view of a prior art position measurement system for use in a lithography system, in which the position of the optical column 14 is measured relative to a target carrier 13 carrying a target 12. The target 12 is partitioned into strips along the long-stroke direction L. Patterning of the target 12 may commence when point p1 of the target is placed under the optical column 14 of a lithography system. Because of the scanning deflection of the beamlets, any part of the strip can be reached by the beamlets when the target 12 is moved under the optical column 14 by the long-stroke actuator of the lithography system. When point P2 of the target 12 is under the optical column 14, the short-stroke actuator may be used to move the target in a direction perpendicular to the long-stroke direction L, such that point P3 of the target is placed directly underneath the optical column 14, and the next strip may be processed. Target carrier 13 is provided with straight edges 15,16, or mirrors, wherein edge 15 is perpendicular to the long-stroke direction L, and edge 16 is perpendicular to short-stroke direction S. The edges 15,16 are adapted reflecting one or more beams 21a,21b, 23a,23b respectively from interferometers 20,22 for keeping track of a change in distance between said interferometer and edge 15 and 16 respectively of the target carrier 13. Based on any changes in these distances a position of the target 12 relative to the optical column 15 is calculated, i.e. the position is obtained indirectly as a function of change in the distance along the long- or short-stroke directions. Any changes in said distance will lead to a change in the calculated position, even if the changes in distance are not caused by a long-stroke or short-stroke actuator of the system. For instance, when the edge 15 deforms, changing the tilt of the edge and/or changing the focus of interferometer beam 21a incident on the edge 15, the calculated position of the target 12 relative to the optical column 14 will change. Moreover, any changes in the position or orientation of the interferometer 20 will affect the calculated position as well.

Figure 3:
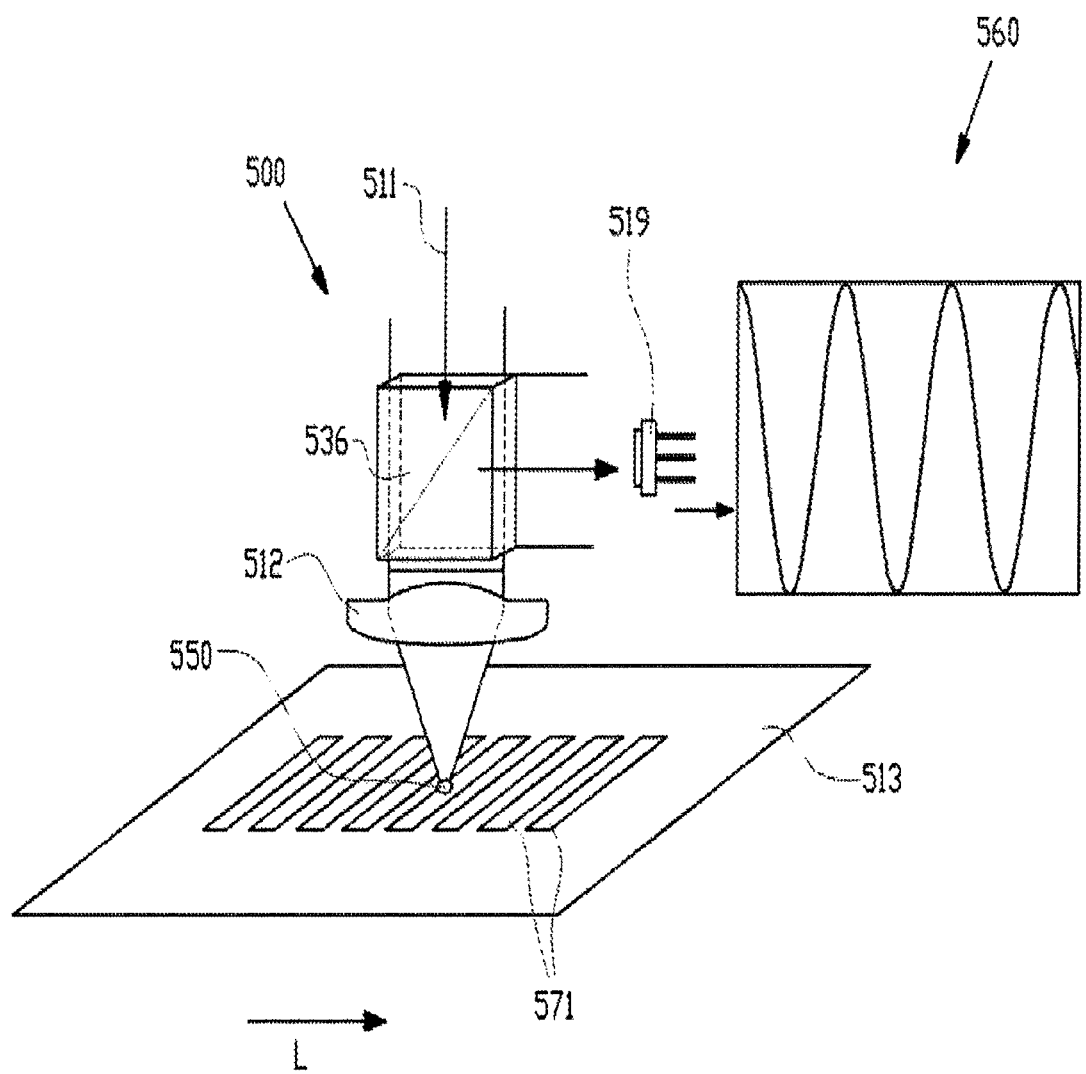

FIG. 3 schematically shows a position device 500 according to the invention, for detecting an alignment and/or position of a beam spot 550 on a substrate 513 according to the invention. The substrate 513 comprises a partially reflective surface, said surface having a substantially constant reflection coefficient, and provided with beam absorbing structures 571, which vary a specular reflection coefficient of the substrate along the longitudinal direction L. A light beam 511 of a predetermined wavelength is passed through beam splitter 536 and is focused by focusing lens 512 onto a spot on the substrate 513, and partially reflected therein. The intensity of the reflected beam is detected by beam intensity detector 519. Graph 560 shows a plot of the detected beam intensity vs. position of the spot on the substrate, when the substrate is moved along the longitudinal, or long-stroke, direction L. The position device is adapted for alignment of a beam spot on a substrate. This is particularly useful when several layers of patterns are overlain during separate processing sessions of a same target. Once the target has been aligned the position may be tracked using other position measuring means known in the art, such as interferometers.

Alternatively, the position device may be used to track a position of the beam on the substrate during processing of the target, e.g. during preparation and/or exposure of a target in a lithography system, based on the number of peaks encountered in the detected intensity signal. Based on the number of peaks encountered and the actual detected intensity value, an even more accurate position can be determined.

Figure 4:
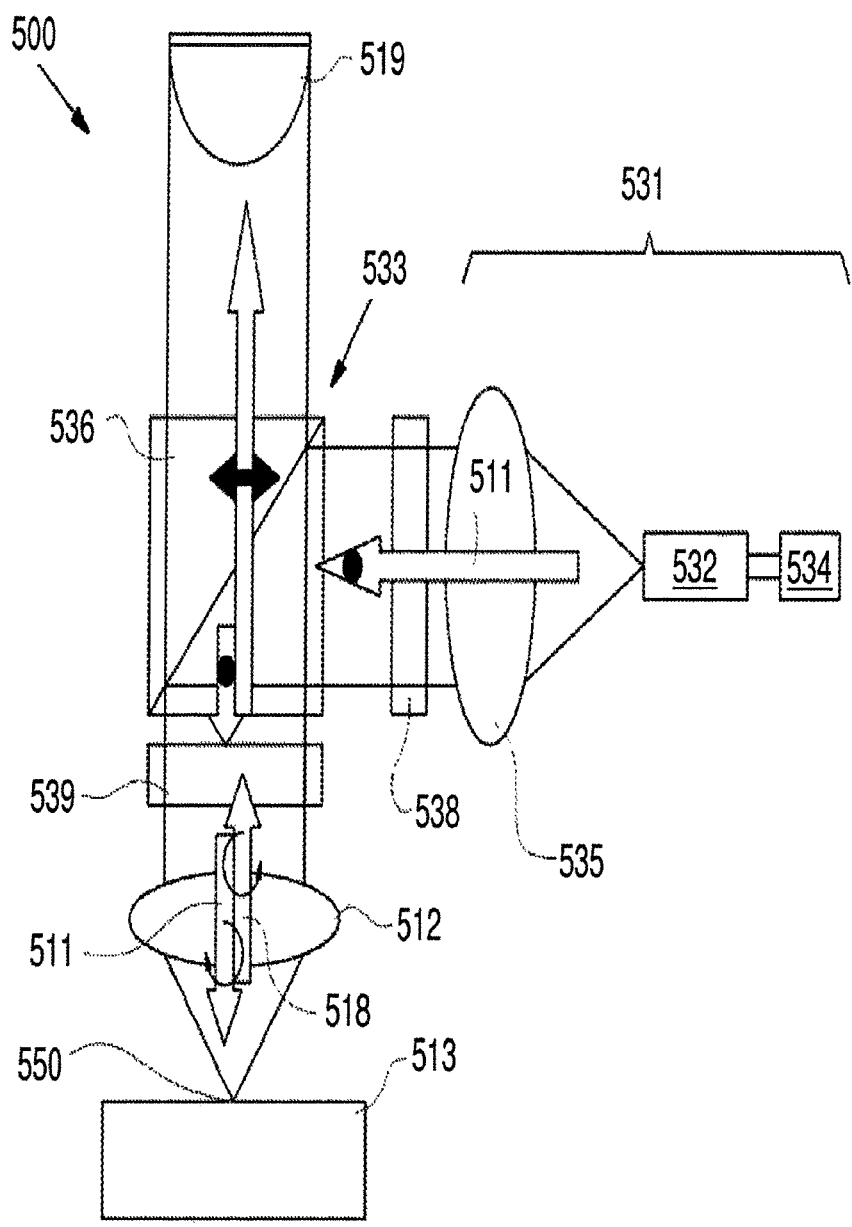
FIG. 4 shows a schematic detail of a position device according to the present invention.

FIG. 4 schematically shows a position device 500 according to the invention in more detail. The position device is adapted for detecting the position of a beam spot 550 on a substrate 513 according to the invention. Beam source 531 comprises a laser 534 for providing a light beam 511 with a wavelength in the range of 600-650 nm, or about 635 nm. The beam source 531 further comprises an optical fiber 532 for guiding the light beam 511 from the laser 534 towards the optical system 533. The beam leaving the optical fiber 532 preferably has a nearly perfect Gaussian profile and may be easily collimated. The beam source comprises a collimator lens 535 arranged for collimating the beam 511 from optical fiber 532. However, when a fiber is not used and the laser or another beam generating device is providing a collimated beam, such a collimating lens 535 may not be required.

The optical system 533 further comprises a beam splitter 536, for directing the beam 511 towards surface of the substrate 513. A focusing lens 512 of the optical system focuses beam 511 on the surface 513. The reflected beam 518 is generated by specular reflection of the beam 511 in the substrate 513. The focus lens 512 may also be used for collimating the reflected beam 518. The reflected beam 518 is directed towards the beam intensity detector 519 by beam splitter 536.

The beam intensity detector 519 comprises a photodiode. Alternatively it may comprise an un-biased silicon PIN diode working in the photovoltaic mode. This mode may lower the amount of heat generated with respect to a biased mode operation of a photodiode. The beam intensity detector may also comprise an operational amplifier to convert the current from the photodiode into a voltage which may be filtered. The filtered voltage may be converted to a digital signal that may be used by a processor for determining a position or displacement of the surface 513 relative to the optical system 533.

The active area of the beam intensity detector 519 is larger than the diameter of the reflected light beam leaving the beam splitter so that substantially all of the energy leaving the beam splitter is detected. However, another focus lens (not shown) located between the beam splitter 536 and the beam intensity detector 519 may be used for focusing the reflected light beam on the beam intensity detector 519. In this way the effective area of the beam intensity detector may be smaller than the diameter of the reflected light beam leaving the beam splitter 536.

In a non-polarizing beam splitter 536 it may be the case that 50% of the light beam 511 is directed towards the substrate 513, while the other 50% may be lost. And of the reflected light beam only 50% may be directed to the beam intensity detector 519, while the other 50% may be lost. This implies that 75% of the light beam 511 is lost, i.e. is not used for the position and/or alignment detection.

Therefore, a polarizing beam splitter 536' may be used in an embodiment of the mark position detector device according to the invention. In that case, the beam source 531 may provide a polarized light beam 511'. The beam source may comprise a polarizer 538 arranged for transforming a non-polarized light beam into a polarized light beam 511. Light beam 511 may be an S-polarized light beam, which is indicated in the figure by a dot.

The polarizing beam splitter 536' may be arranged for guiding the S-polarized light beam towards the surface of the substrate. The optical system may further comprise a quarter wave plate 539, which may be located between the beam splitter 536' and the focus lens 512. When the light beam 511' travels through the quarter wave plate 539, it its polarization is changed from S-polarization into a right circular polarization, as is indicated by a curved arrow in the figure. When the beam 511' is reflected by the surface 513, polarization may change again: the reflected light beam may have a left circular polarization, as is indicated by another curved arrow in the figure. When the reflected light beam 518 travels through the quarter wave plate 539, its polarization is changed from left circular polarization into a P-polarization which is indicated by a straight arrow in the figure. Polarizing beam splitter 536' is arranged to guide the P-polarized reflected light beam towards the light intensity detector 519.

The use of a polarized light beam 511' and reflected light beam 518 and a polarizing beam splitter 536' results in a reduction of stray light, back reflection and energy loss in the beam splitter 536'.

Figure 5:
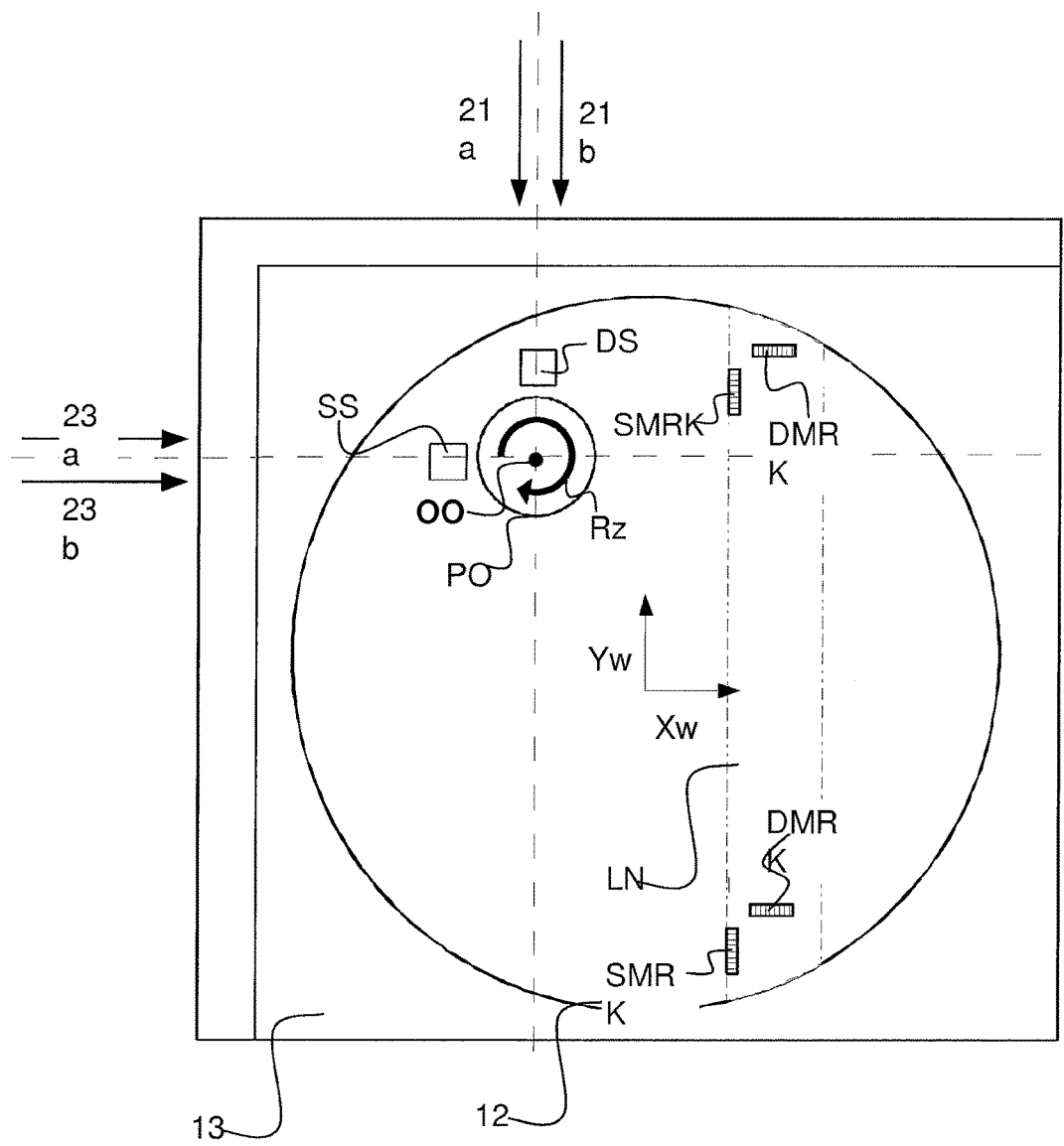
FIG. 5 shows part of a lithography system of the invention.

FIG. 5 shows part of a lithography system of the invention. This part comprises the movable target carrier (or chuck) As discussed earlier the position of the chuck is determined using the one or more beams 21a, 21b, 23a, 23b from interferometers (not shown). Such position is determined with respect to the projection optics PO of the lithography system. However, despite the fact that the position of the chuck 13 is known, still the exact position of the target 12 (substrate or wafer) with respect to the projection optics PO is not known. Special clamping measures can be taken such that the position and orientation of the substrate 12 on the chuck 13 is known with limited accuracy, for example +−20 μm, referred to a the coarse position hereinafter. The substrate 12 is provided with optical position marks SMRK, DMRK which have a known position with regards to the coordinate frame of the wafer. The exact positions, i.e. wafer coordinates Xw, Yw of the optical position marks with respect to the projection optics PO are determined using the knowledge of the coarse position of the optical position marks SMRK, DMRK. These positions are determined using two optical alignment sensors SS, DS with the method of the invention as described in the claims (however it may alternatively also be done using a single optical alignment sensor). The optical alignment sensors SS, DS each have a fixed and known relative position with respect to the projection optics PO. In this embodiment each optical alignment sensor SMRK, DMRK is dedicated to measuring in one direction only (so determining a position with respect to one axis only). This is done in such a way that the first optical alignment sensor SS, displaced in the direction of the X-axis with respect to the projection optics PO, measures the second position mark DMRK, in a direction complying with the x-axis Xw. The second optical alignment sensor DS, displaced in the direction of the Y-axis with respect to the projection optics PO, measures the first position mark SMRK in a direction complying with the y-axis Yw. The consequence of this is that a rotational error Rz of the chuck 13 around the z-axis is tolerated to some extent, namely by the width of said optical position marks SMRK, DMRK. A substrate (or wafer) 12 typically comprises multiple lanes LN, each comprising a plurality of dies (not shown). All dies are separated from each other by scribe lines, i.e. areas that are reserved for separating the dies by cutting through the scribe lines. Optical alignment marks are preferably places within such scribe lines, such that no unnecessary area is lost.

Figure 6:
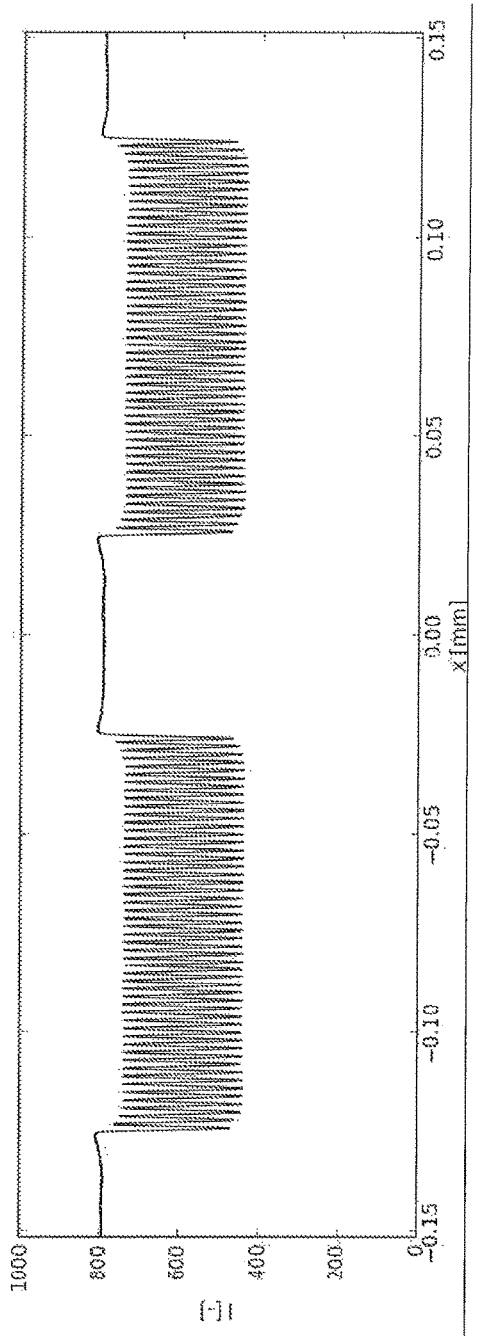
FIG. 6 shows a modeled intensity profile belonging to the substrate comprising the optical position mark of the invention.
Figure 7:
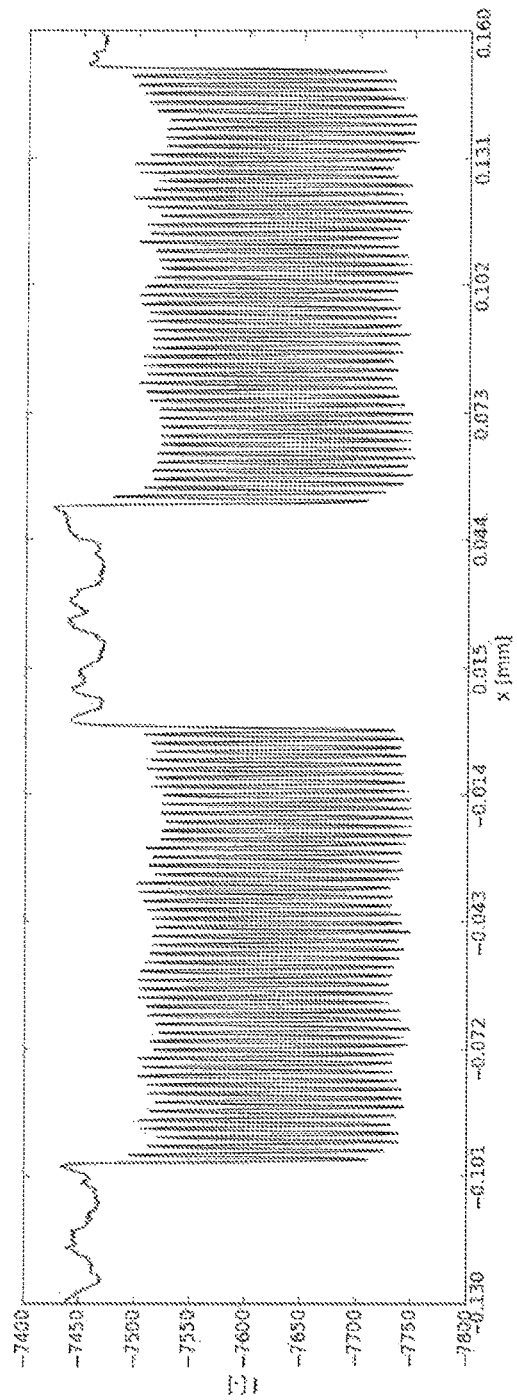
FIG. 7 shows a measured intensity profile using the lithography system of the invention.
Figure 8:
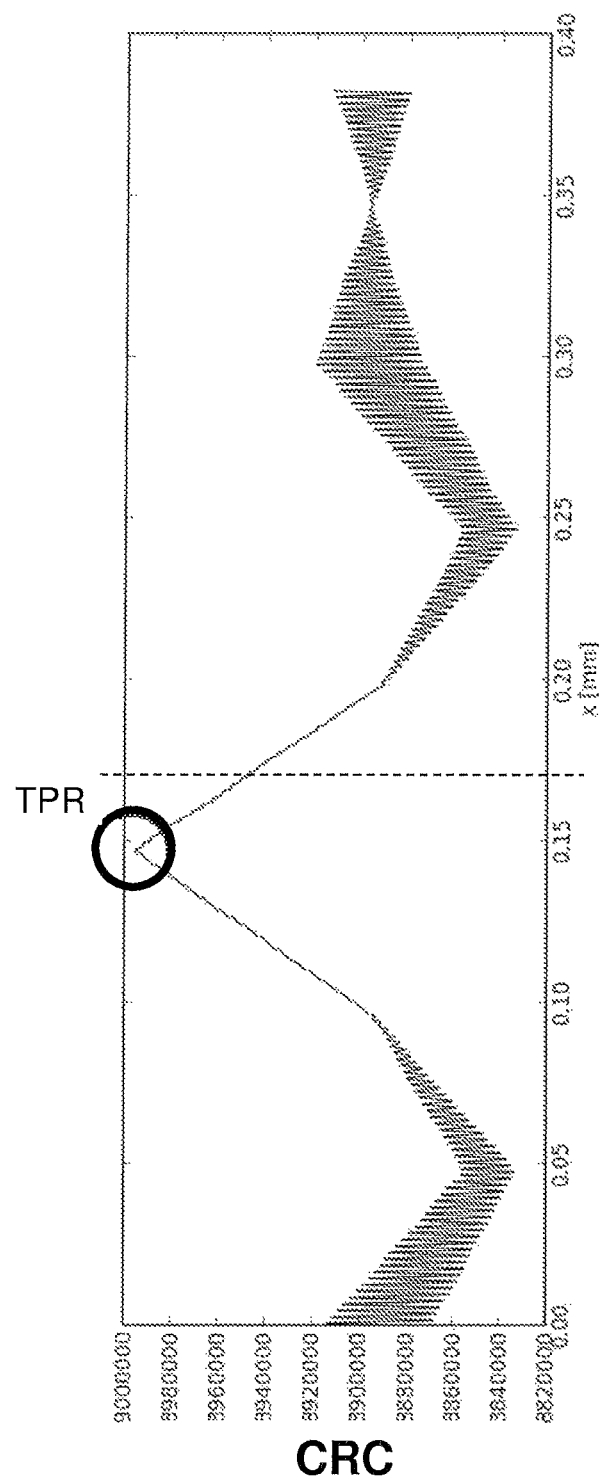
FIG. 8 shows a calculated cross-correlation function between the charts of FIGS. 6 and 7.

The next figures further illustrate the method of determining a position of a substrate in accordance with the invention. FIG. 6 shows a modeled intensity profile belonging to the substrate comprising the optical position mark of the invention. FIG. 7 shows a measured intensity profile using the lithography system of the invention. FIG. 8 shows a calculated cross-correlation function between the charts of FIGS. 6 and 7. As already discussed the substrate 513 in accordance with the invention comprises an optical position mark SMRK, DMRK for being read-out by an optical recording head 500 for emitting light of predetermined wavelength, preferably red or infra-red light, more in particular of 635 nm light. The optical position mark DMRK, SMRK having a mark width, a mark length and a predetermined known position on the substrate 513. The optical position mark SMRK, DMRK extends along a longitudinal direction X,Y and being arranged for varying a reflection coefficient of the position mark along said longitudinal direction. When the light intensity I is plotted versus the longitudinal position X an intensity profile as shown in FIG. 6 is obtained. The profile of FIG. 6 has been simulated and is based upon an optical position mark as discussed later in this description with reference to FIGS. 9, 15-17, and 20. It is not essential that such profile is simulated. It may alternatively be measured on a test substrate comprising such optical position mark. What is important for the invention is that at least an expected intensity profile is obtained before the method is carried out. Subsequently, using the coarse (not-accurate) position the optical alignment sensor is used to scan over the optical position mark and measure an intensity profile. The scan path is chosen intentionally longer than the mark length, such that any inaccuracy in the coarse position is taken into account in that it is at least sure that the scan path fully covers the optical position mark. FIG. 7 shows a measured intensity profile. When comparing the profiles of FIGS. 6 and 7, a couple of differences are observed. First, the center between the regions having periodically varying reflectivity is shifted. It is exactly this shift which gives the measure for the exact position of the optical position mark with respect to the projection optics. Second, the measured intensity profile is a somewhat deformed version of the measured intensity profile. Third, the scales of both profiles are quite different. Such deformation and scale difference would in the prior art solution cause difficulties in determining a position from the measurement. However, the invention conveniently circumvents such problems by using a very simple position mark combined with a cross-correlation method to determine the shift between the measured intensity profile and the expected (simulated or measured) intensity profile. FIG. 8 shows a possible cross-correlation curve obtained from cross-correlating FIGS. 6 and 7. Cross-correlation calculation as such is considered well-known to the person skilled in the art. Various text books are available on this topic. FIG. 8 shows the cross-correlation coefficient CRC as a function of a shift of one said intensity profiles. The figure clearly shows that if FIG. 7 is shifted over a distance of about 0.15 μm that the cross-correlation coefficient is the highest (within the top region TPR), i.e. in that case both intensity profiles resemble each other the most. This figure of 0.15 μm is the correction factor to be added to the earlier-mentioned coarse position to obtain the accurate position of the substrate with respect to the projection optics.

It can be observed that, apart from the clearly visible peak in the curve, there is some periodically varying component super-positioned on this curve. Such varying component may cause an error as it may distort the cross-correlation measurement in that the peak that is slightly shifted with respect to the real shift of the measured curve. An important improvement which leads to an even higher accuracy of the determined position is to first interpolate and filter around the top region TPR of the curve, such that this varying component is at least substantially removed. Subsequently the shift may be determined from the cross-correlation curve.

Figure 9:
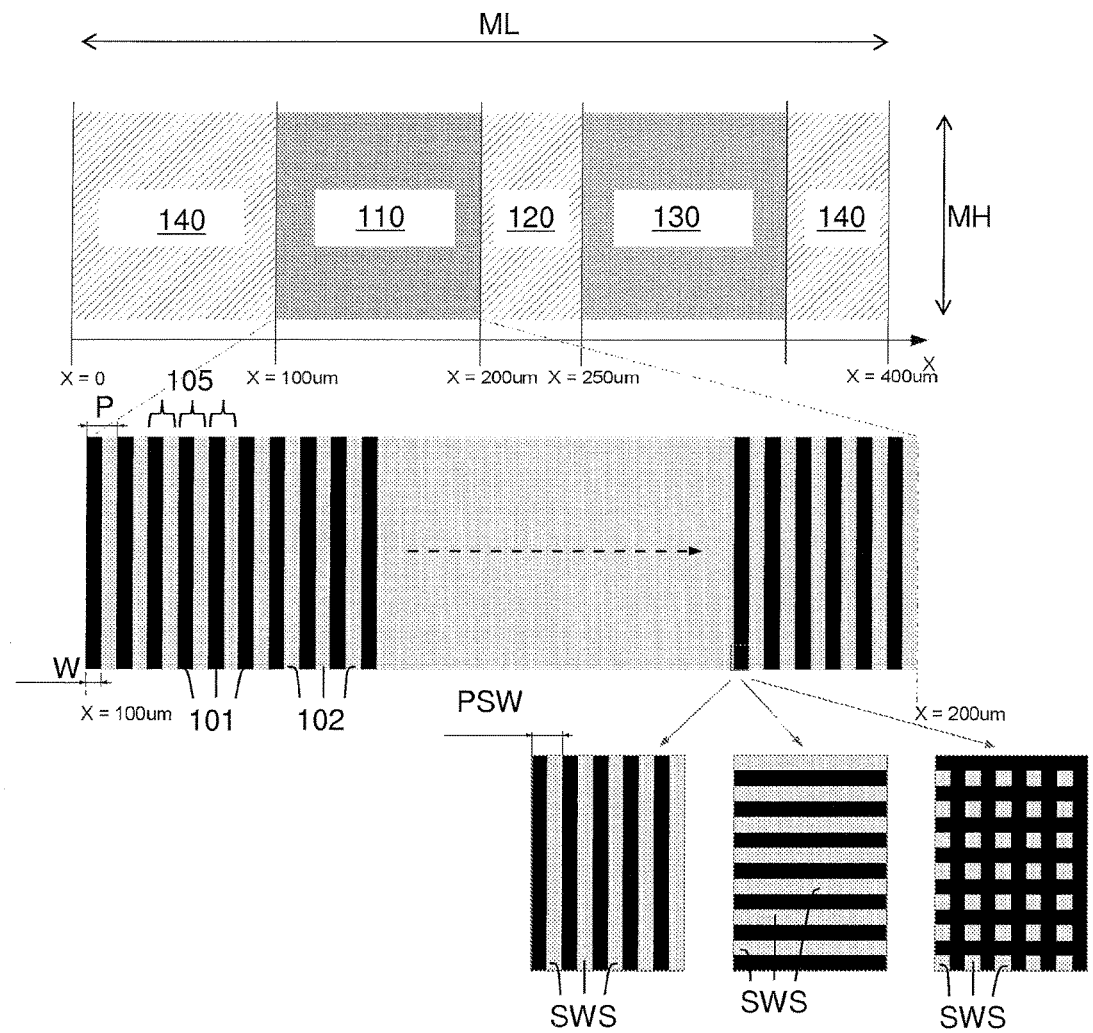
FIG. 9 schematically shows a substrate comprising an optical position mark according to the invention.

FIG. 9 schematically shows a substrate comprising an optical position mark according to the invention. This embodiment comprises a first main region 110, a second main region 120 neighboring the first main region 110, and a third main region 130 neighboring the second main region 120. The regions are position such that the optical position mark extends in a longitudinal direction X. At both ends of the optical position mark 140 there is provided end regions 140. The second main region 120 and the end regions 140 are empty regions, i.e. being free of structures, thereby providing a high reflection coefficient. The first main region 110 and the third main region 130 comprise absorbing structures, thereby providing a reflection coefficient that is lower than the reflection coefficient of the empty regions 120,140. It is not essential that the optical position mark has an empty region in the middle. Such region only enhances the optical visibility of the position mark, such that it may be quickly found during experiments. It is also not essential that the end regions 140 are empty. However, such empty regions have a positive impact on shape of the cross-correlation coefficient curve, i.e. the peak will become higher, because the optical position mark can be more easily distinguished from its environment. In this example the first and third regions 110,130 have a length of 100 μm, and the second main region 120 has a length of 50 μm. The end regions 140 in this example have a different length, namely 100 μm, and 50 μm. However, it is not essential that these regions have a different length. The height MH of the optical position mark is preferably less than 40 μm, which is the maximum dimension that fits in a conventional scribe line. Typically, the mark height MH is slightly less than 40□ μm in the embodiments discussed in this description. The reason for choosing a value close to the maximum dimension is to obtain the maximum tolerance for position accuracy in that direction, namely +−20 μm. The total mark length ML is 450 μm.

Within the first main region 110 and the third main region 130 there is a plurality of region pairs 105. Each region pair 105 comprises a first region (or sub-region) 101 having a first reflection coefficient (typically a low coefficient) and a second region 102 having a second reflection coefficient (typically a high coefficient) different from the first reflection coefficient. The first region 101 has a width W that is equal to the width of the second region 102. Consequently, the pitch of each region pair 105 is twice said width W. Depending on the chosen pitch P a predefined number of region pairs fit within the main region 110, 130. As can be observed in FIG. 9, the optical position mark of the invention has a very regular structure, which is advantageous as discussed earlier in this description.

Figure 20:
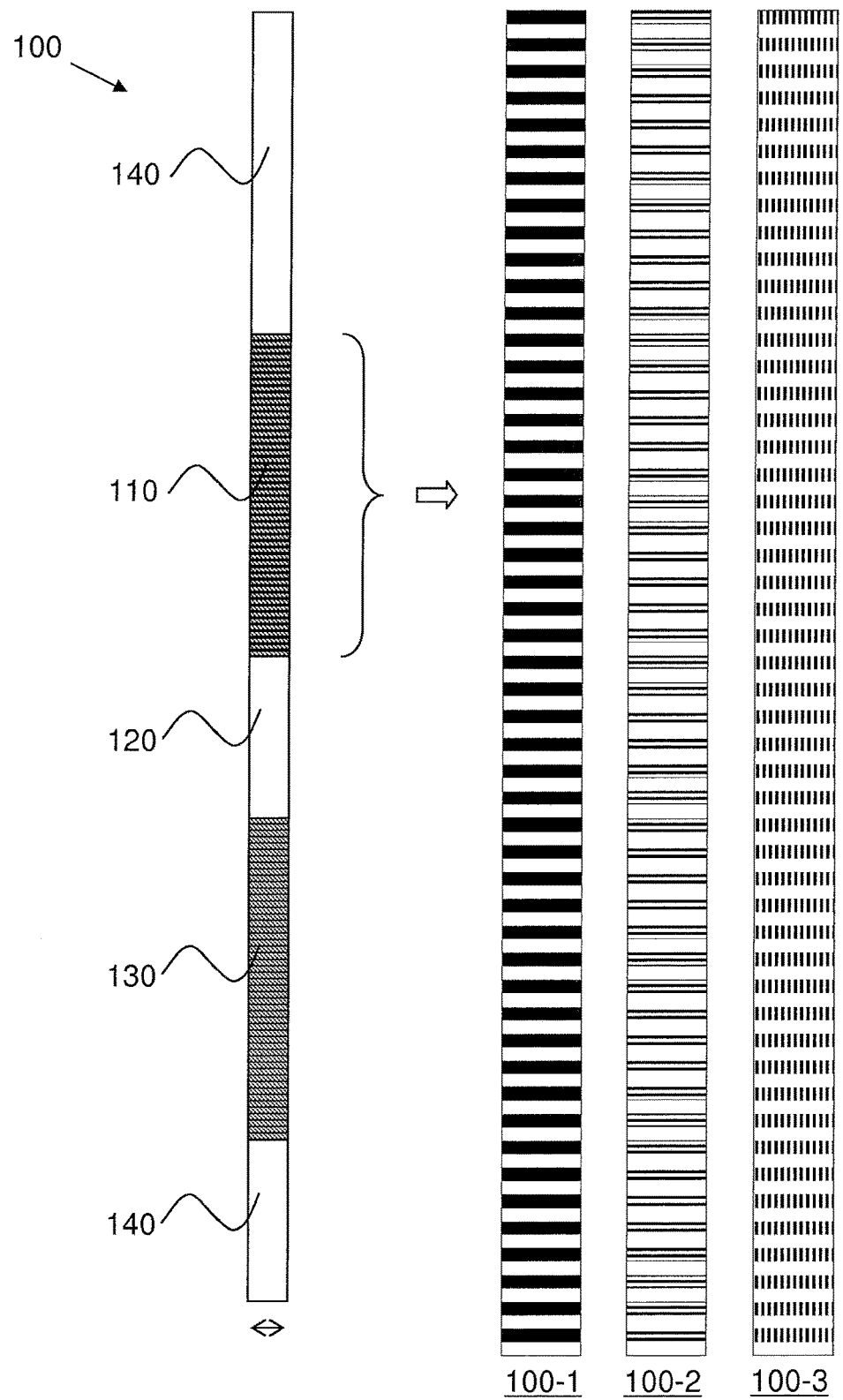
FIG. 20 shows a more detailed view of the optical position mark of FIG. 9.

FIG. 9 further shows a third level of segmentation in accordance with the invention, namely that the (black) regions 101 having a low coefficient comprise sub-wavelength structures SWS, wherein sub-wavelength is defined with respect to the wavelength of the light used in the optical reading device for scanning said optical position marks. In the current example the sub-wavelength structures have a sub-wavelength pitch PSW of 200 nm (width is 100 nm and spacing is 100 nm). In case a DVD read-head is used, the wavelength of the light is typically 635 nm (red light). In order to keep the regularity high the segmentation may be vertical, horizontal or dots (both vertical and horizontal segmentation) as illustrated in the figure. FIG. 20 shows a more detailed view of the optical position mark of FIG. 9 for three different scenarios, namely without sub-wavelength structures 100-1, with segmentation in the longitudinal direction 100-2, and with segmentation in the transversal direction 100-3.

Figure 10:
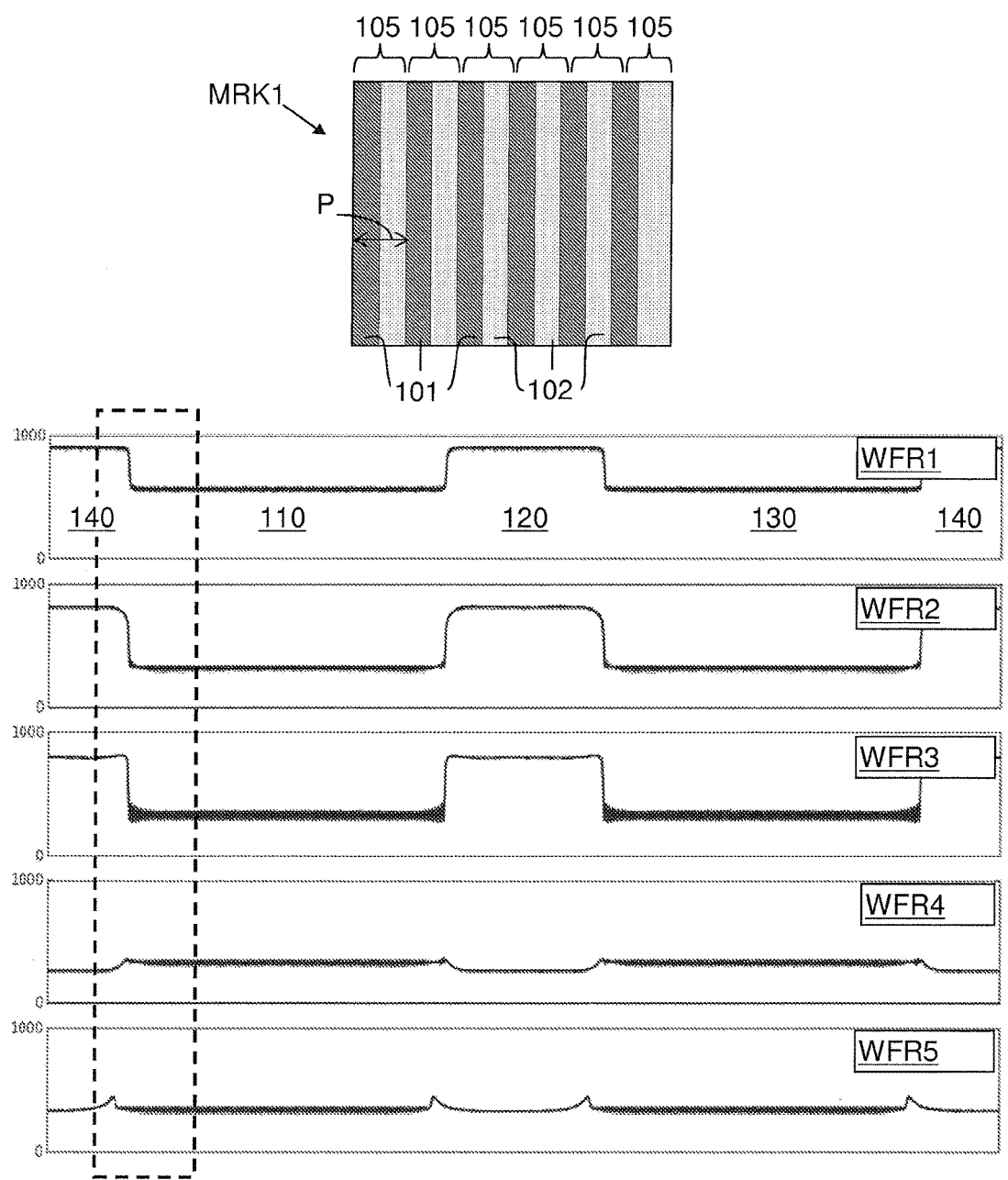
FIG. 10 shows another embodiment of the optical position mark according to the invention combined with measured intensity profiles of such mark for different mask stacks.

FIG. 10 shows another embodiment of the optical position mark MRK1 according to the invention combined with measured intensity profiles of such mark for different mask stacks. The pitch P in this embodiment is 1 μm. Within the first regions 101 there is no further segmentation. Hence, the width of the first regions 101 is 500 nm, which is a sub-wavelength dimension in case visible red light is used for reading the intensity profile for the optical position mark. During operational use of a lithography apparatus, such as an E-beam apparatus there are masking layers provided on top of the substrate. Such masking layer includes at least an E-beam resist, but it may comprise more layers. Furthermore, five different wafers WFR1,WFR2,WFR3,WFR4, WFR5 each having different mask layer stacks have been tested to determine the influence of those layers on the position determination method of the invention. In the first wafer WFR1 the substrate does not have any masking layers. In the second to the fifth wafer the substrate comprises a masking layer stack comprising an E-beam resist layer combined with a hard-mask layer (such as spin-on-carbon) having a thickness which increases from the second wafer WFR2 to the fifth wafer WFR5. In between the hard-mask layer and the resist layer there may be a further layer, such as an anti-reflection coating layer and/or an adhesion layer. It is observed from FIG. 10, that the second wafer WFR2 and the third wafer WFR3 have the largest dynamic range in intensity values. From FIG. 10, clearly the main regions and end regions of the optical position mark can be observed, i.e. the light intensity is the lowest for the first main region 110 and the third main region 130, because these regions comprise the structures which at least partially absorb or scatter the incident light.

Figure 11:
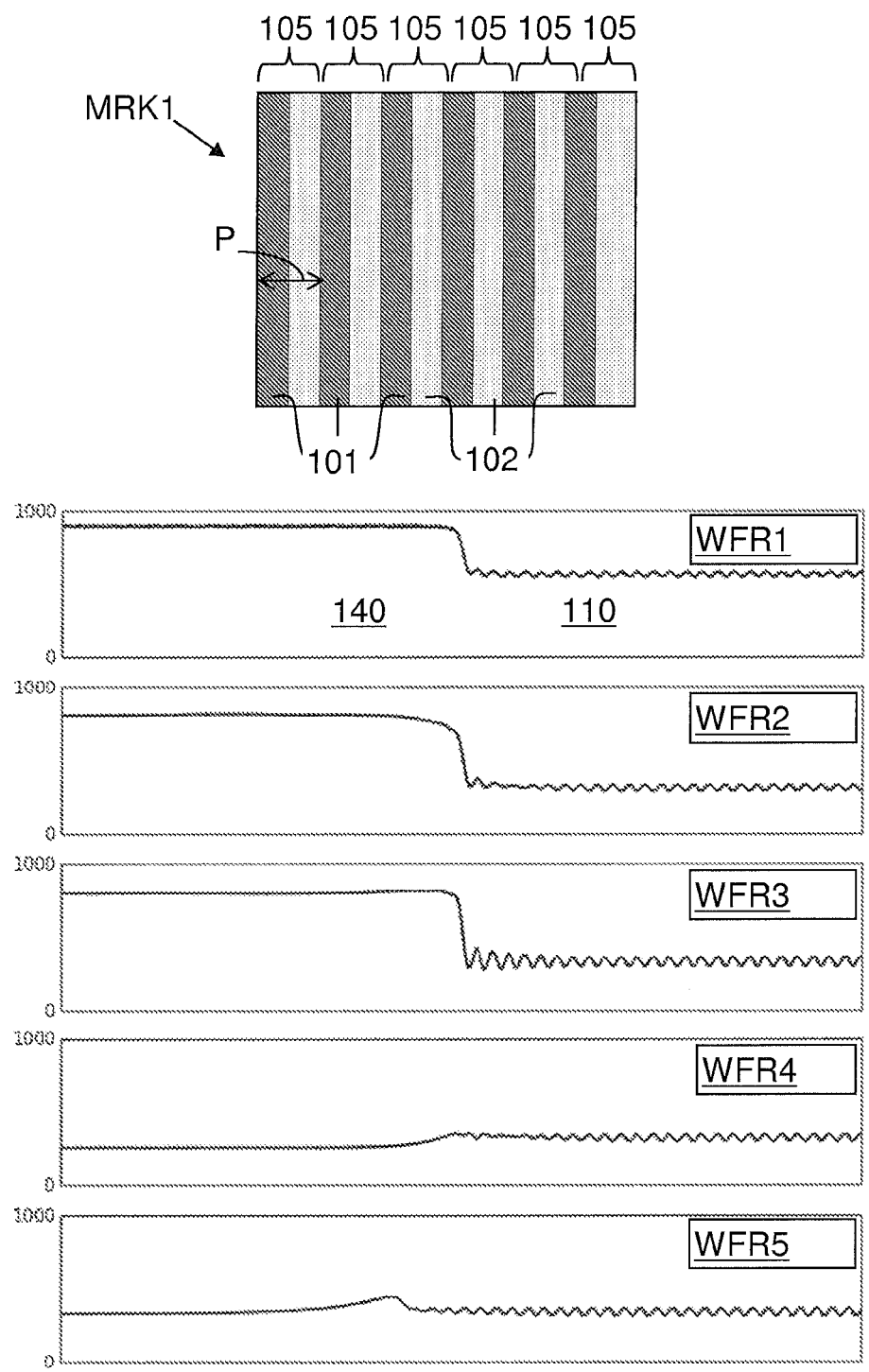
FIG. 11 shows a zoom view of the profiles of FIG. 10, wherein the zoom view is bounded by the dashed rectangle of FIG. 10.

FIG. 11 shows a zoom view of the profiles of FIG. 10, wherein the zoom view is bounded by the dashed rectangle in FIG. 10. It must be noted that in the experiments the spot size was about 1.5 µm, which is larger than the pitch P. The zoom view shows the light intensity profile in the transition from the end region 140 to the first main region 110. A first observation is that the light intensity drops from a high value (maximum reflection in the end region) to a low value, with a variation super-positioned on it. This variation occurs due to the transitions from structure to empty and visa versa. The period of these variations is 1 µm, because the spot (when scanned over the surface in the longitudinal direction) covers between 1 and 2 structures in an alternating fashion. Furthermore, as the masking layer stack increases (comprising spin-on-carbon) the light intensity drops and the difference between the main regions and the end regions and middle region becomes smaller.

Figure 12:
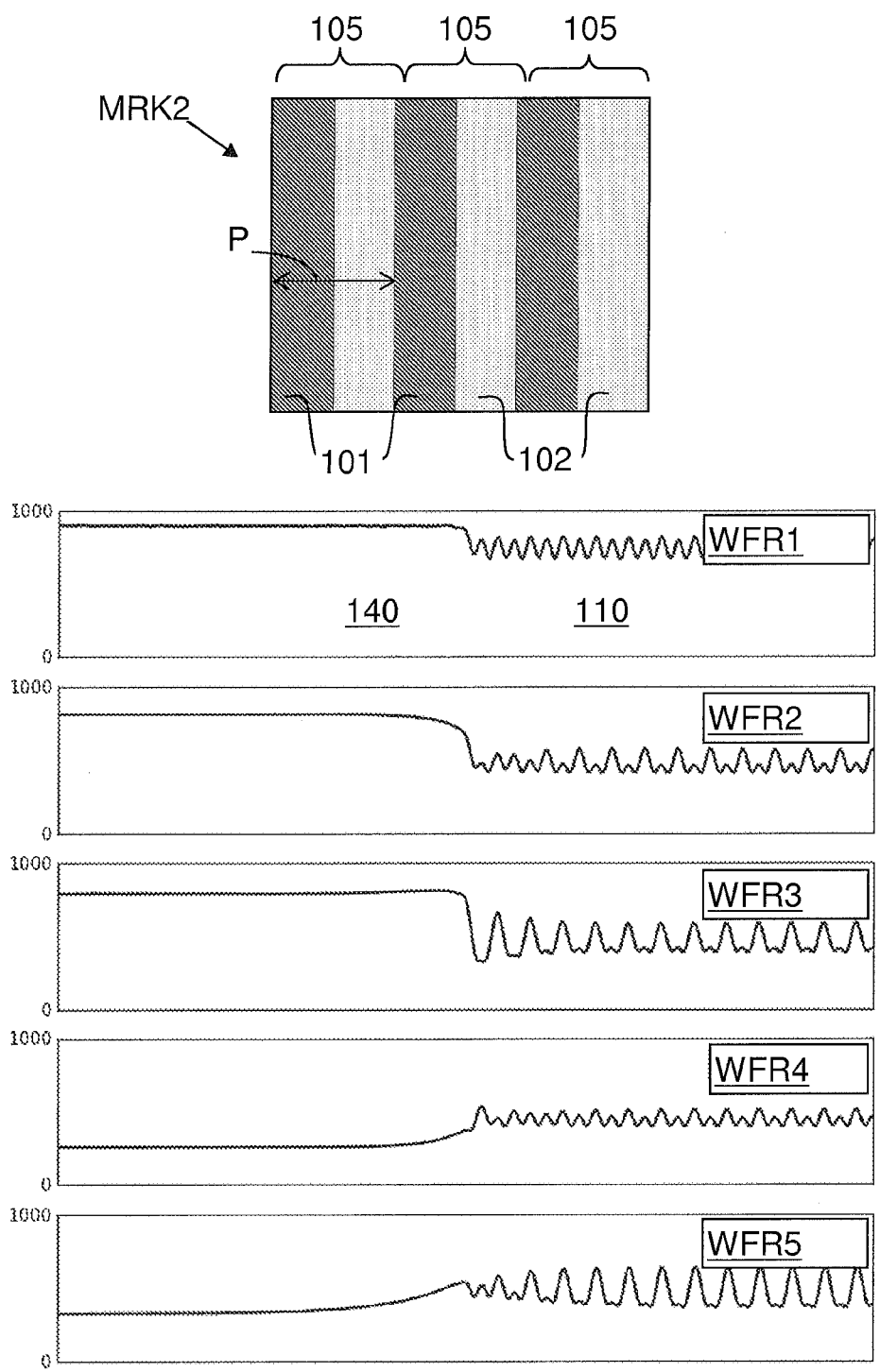
FIG. 12 shows another embodiment of the optical position mark according to the invention combined with a zoom view of the measured intensity profiles of such mark for different mask stacks.

FIG. 12 shows another embodiment of the optical position mark MRK2 according to the invention combined with a zoom view of the measured intensity profiles of such mark for different mask stacks. The pitch P in this embodiment is 2 µm. Within the first regions 101 there is no further segmentation. Within the first regions 101 there is no further segmentation. In this embodiment another phenomenon is observed, namely that there is a minimum in light intensity at each transition. Hence, the period of this variation is 1 µm (half the pitch P). Striking observation is that in the absence of a masking layer stack the difference in light intensity between the end regions 140 and the main regions 110, 130 is quite low.

Figure 13:
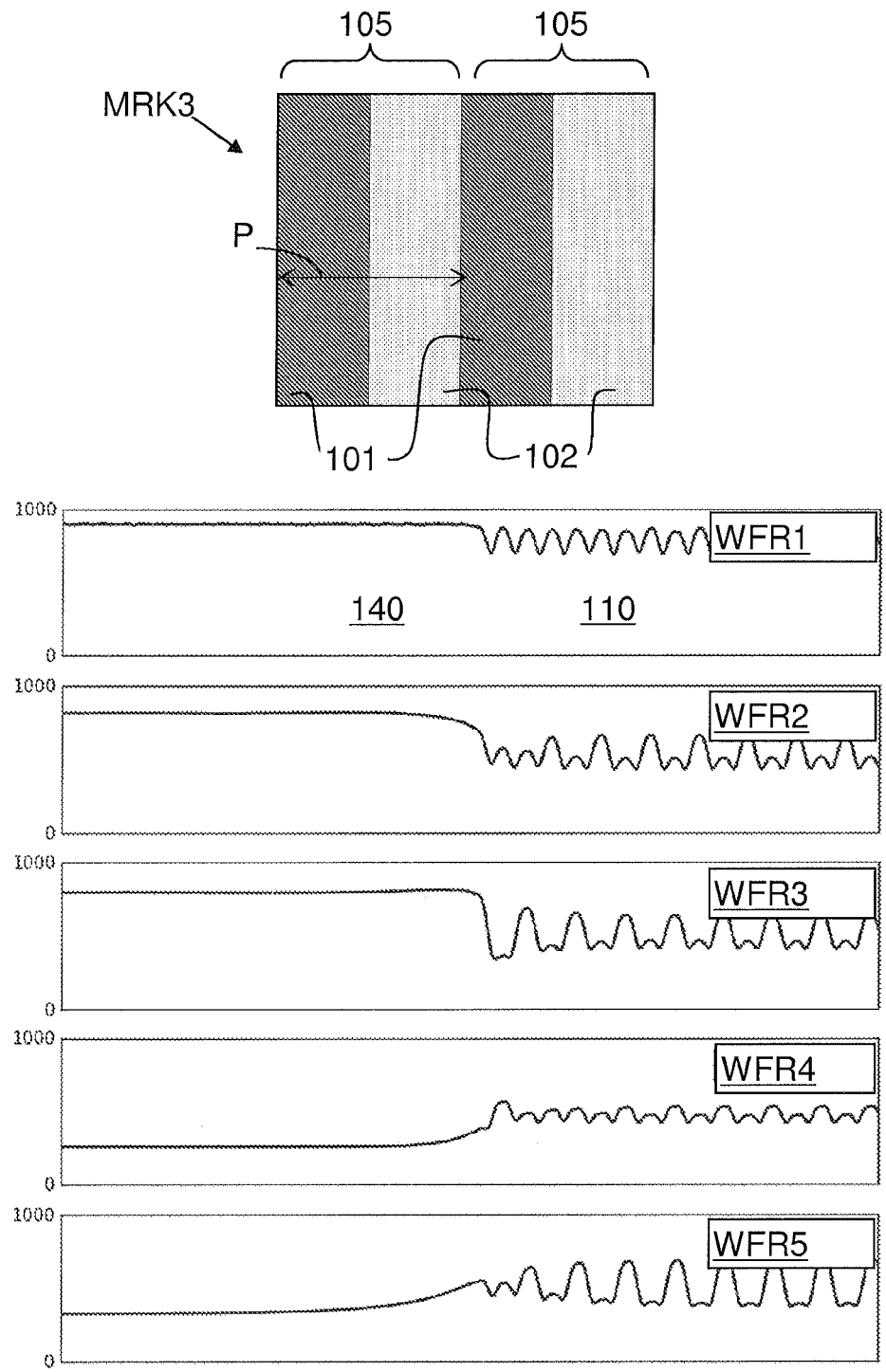
FIG. 13 shows another embodiment of the optical position mark according to the invention combined with a zoom view of the measured intensity profiles of such mark for different mask stacks.

FIG. 13 shows another embodiment of the optical position mark MRK3 according to the invention combined with a zoom view of the measured intensity profiles of such mark for different mask stacks. The pitch P in this embodiment is 3 µm. Within the first regions 101 there is no further segmentation. There is a minimum in light intensity at each transition. Hence, the period of this variation is 1.5 µm (half the pitch P).

Figure 14:
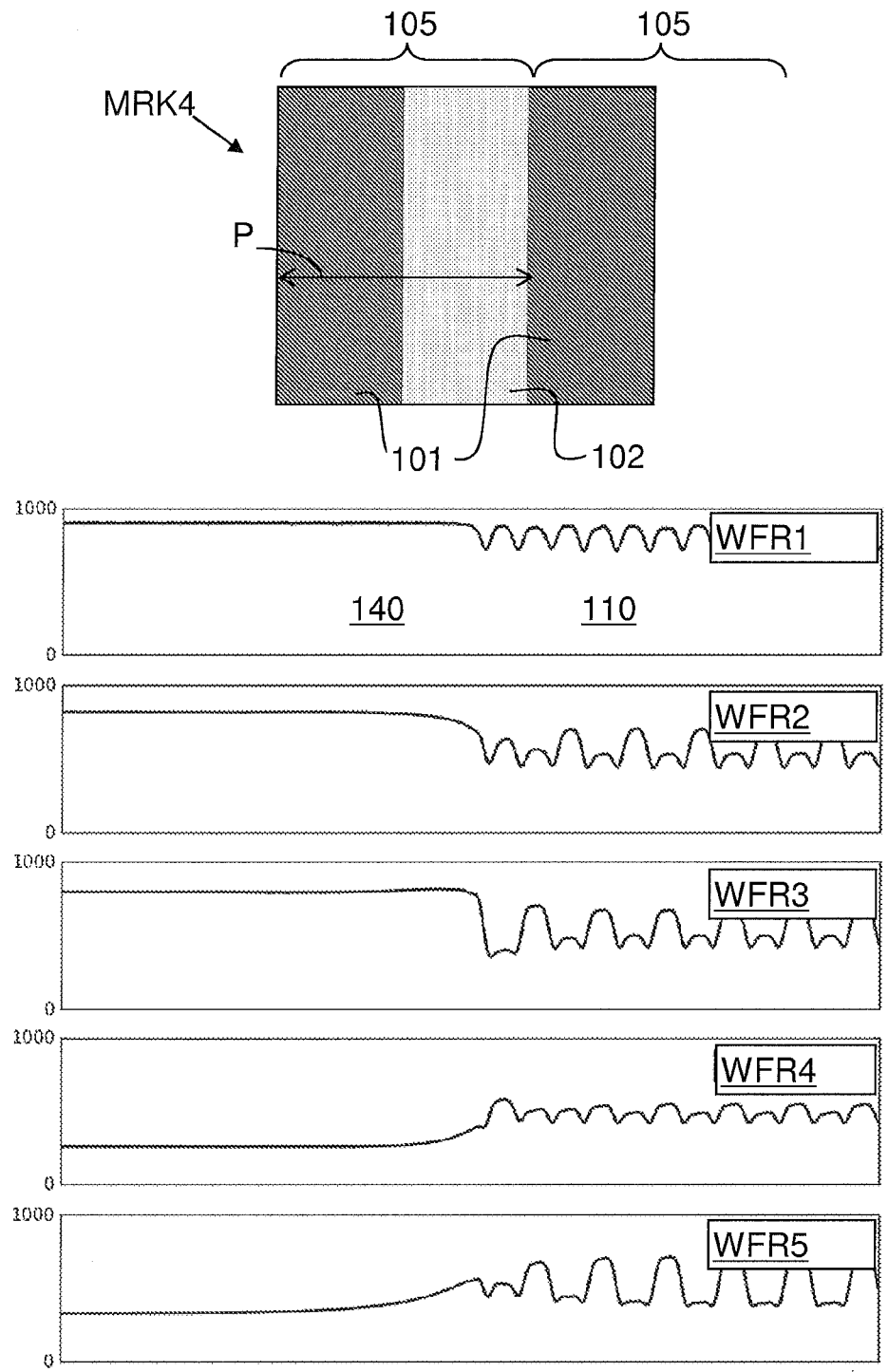
FIG. 14 shows another embodiment of the optical position mark according to the invention combined with a zoom view of the measured intensity profiles of such mark for different mask stacks.

FIG. 14 shows another embodiment of the optical position mark MRK4 according to the invention combined with a zoom view of the measured intensity profiles of such mark for different mask stacks. The pitch P in this embodiment is 4 µm. Within the first regions 101 there is no further segmentation. There is a minimum in light intensity at each transition. Hence, the period of this variation is 2 µm (half the pitch P).

Figure 15:
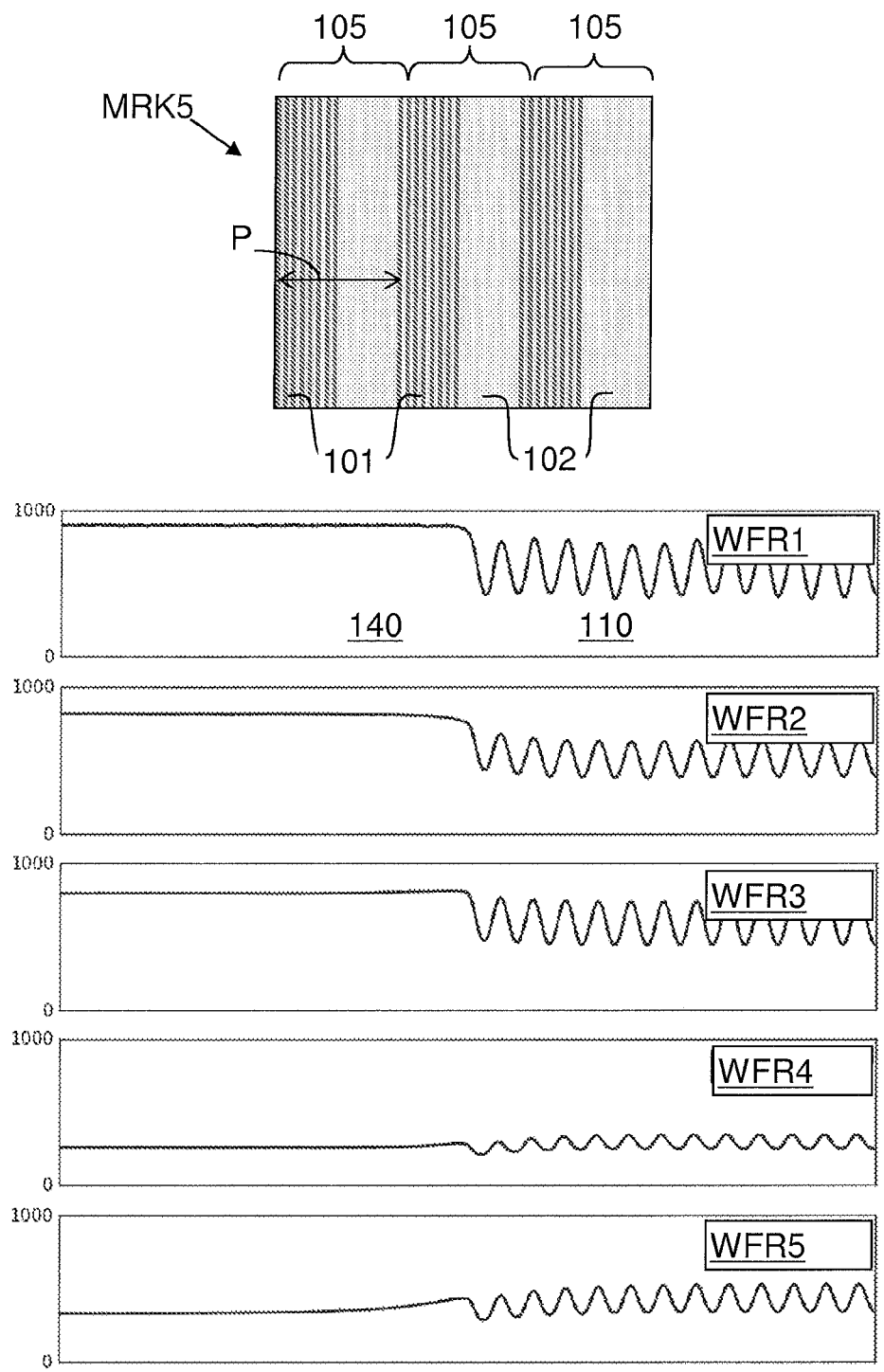
FIG. 15 shows another embodiment of the optical position mark comprising sub-wavelength features according to the invention combined with a zoom view of the measured intensity profiles of such mark for different mask stacks.

FIG. 15 shows another embodiment of the optical position mark MRK5 comprising sub-wavelength features according to the invention combined with a zoom view of the measured intensity profiles of such mark for different mask stacks. The pitch P in this embodiment is 2 µm. Within the first regions 101 there is longitudinal segmentation. In this embodiment a striking observation can be made. The minima of the light intensity are now observed in the middle of the (segmented) features instead of at the transitions. Moreover, the period of this variation is equal to the pitch P. A further striking observation is that the above is valid for all tested masking layer stacks. Expressed differently, the sub-wavelength features provide for an additional advantage, namely that method of determining the position of the invention (using the optical position marks) is much less sensitive to the masking layer stack that is used on top of the substrate. The pitch of the sub-wavelength features is 200 nm.

Figure 16:
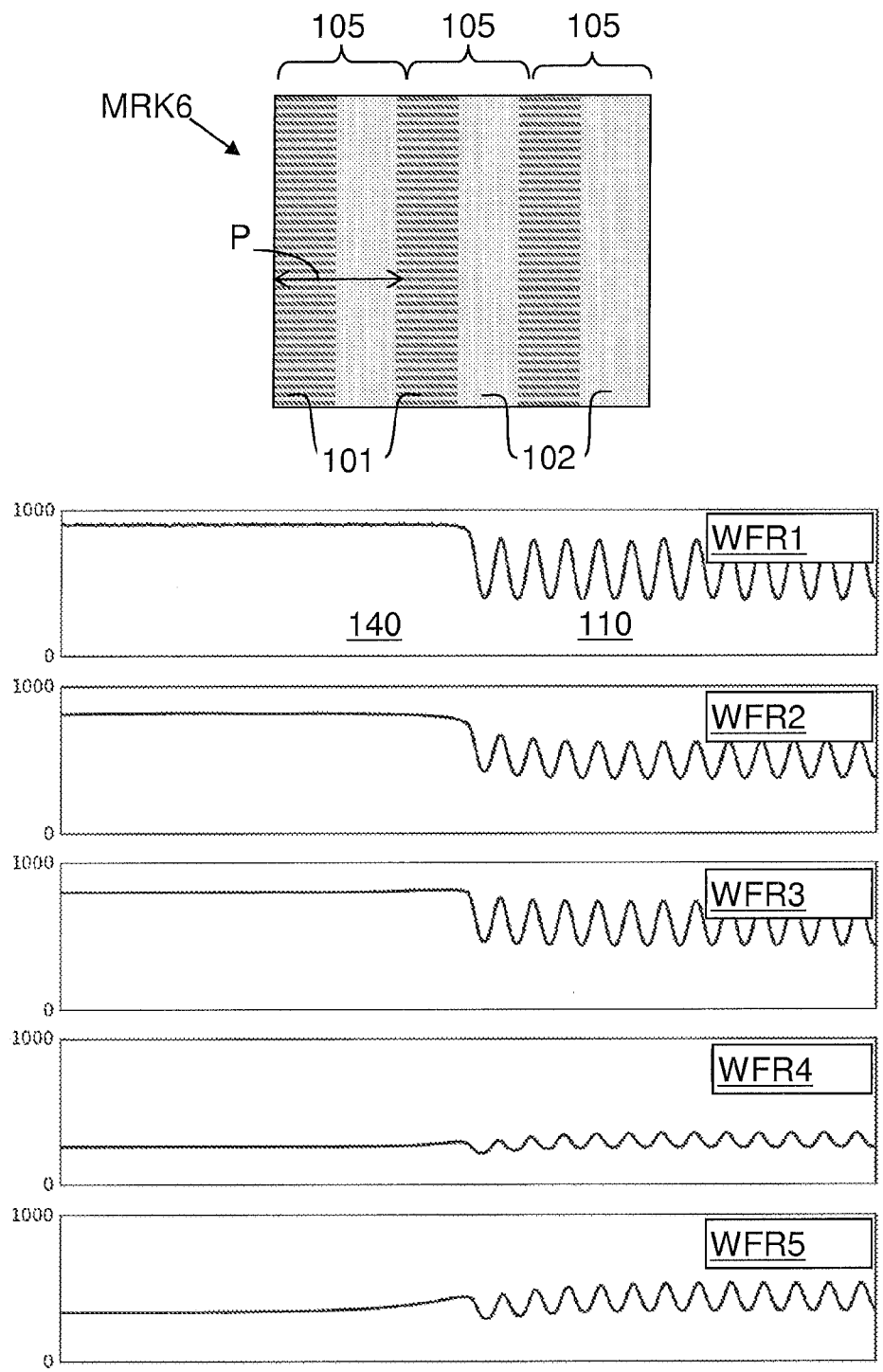
FIG. 16 shows another embodiment of the optical position mark comprising sub-wavelength features according to the invention combined with a zoom view of the measured intensity profiles of such mark for different mask stacks.

FIG. 16 shows another embodiment of the optical position mark MRK6 comprising sub-wavelength features according to the invention combined with a zoom view of the measured intensity profiles of such mark for different mask stacks. The pitch P in this embodiment is 2 µm. Within the first regions 101 there is transversal segmentation. The results for this position mark MRK6 are comparable to those of the fifth position mark MRK5 of FIG. 15. Likewise, this embodiment has the same additional advantage as that of FIG. 15, namely the lower sensitivity to the masking layer stack that is used on top of the substrate. The pitch of the sub-wavelength features is 200 nm.

Figure 17:
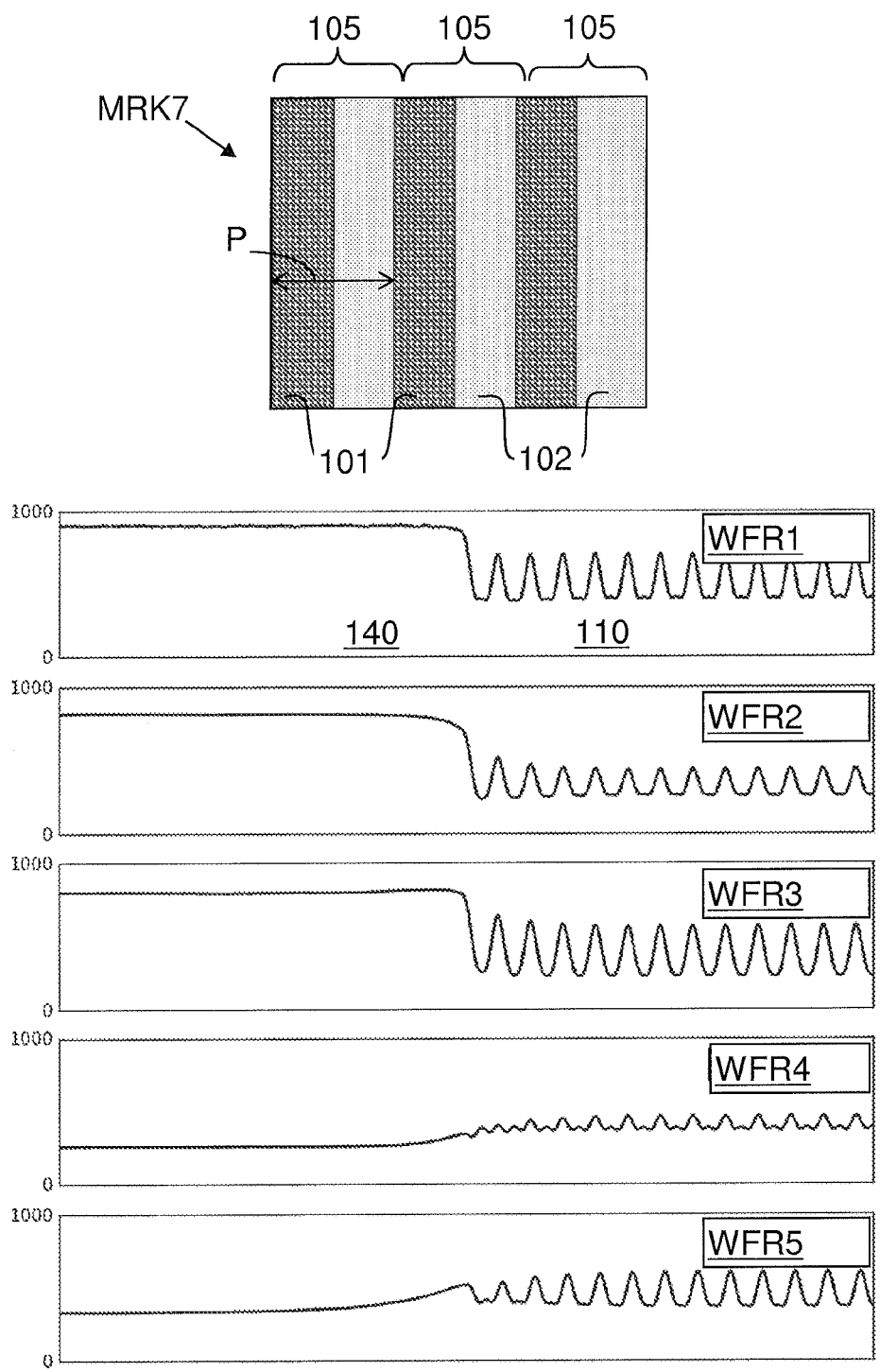
FIG. 17 shows another embodiment of the optical position mark comprising sub-wavelength features according to the invention combined with a zoom view of the measured intensity profiles of such mark for different mask stacks.

FIG. 17 shows another embodiment of the optical position mark MRK7 comprising sub-wavelength features according to the invention combined with a zoom view of the measured intensity profiles of such mark for different mask stacks. The pitch P in this embodiment is 2 µm. Within the first regions 101 there is segmentation in both the longitudinal and transversal direction. The results for this position mark MRK7 are slightly worse than those of the fifth and sixth position mark MRK5,MRK6 of FIGS. 15 and 16. Likewise, this embodiment has the same additional advantage as that of FIGS. 15 and 16, namely the lower sensitivity to the masking layer stack that is used on top of the substrate. An observation is that the curve shape of the intensity profile differs from that of FIGS. 15 and 16. Without being bound by any theory, it is assumed that this can be explained by the fact that the double segmentation in FIG. 17 (thus effectively turning the sub-wavelength structures into poles) ensures that light in both polarization directions is absorbed by the structures, whereas in FIGS. 15 and 16 the absorption is mainly for one of the polarization directions. The pitch of the sub-wavelength features is 200 nm.

General conclusions from the experiments of FIGS. 10 to 17 are.
a) All optical position marks are observable.
b) The amplitudes of the intensity signal decreases for certain masking layer stack thicknesses, and this seems independent of the position mark type.
c) Segmented optical position marks providing sub-wavelength features, provide higher reproducibility.

Figure 18:
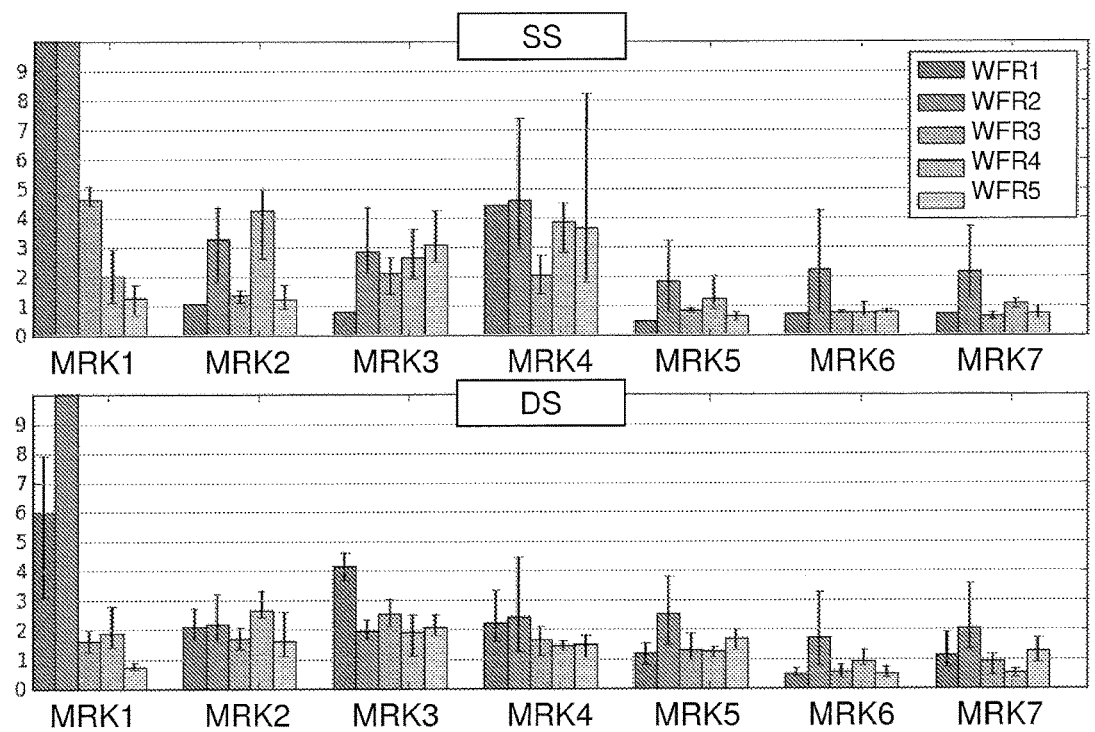
FIG. 18 shows the reproducibility results of the optical position marks of FIGS. 10, 12, 13, 14, 15, 16 and 17 for each optical alignment sensor in the lithography system.

FIG. 18 shows the reproducibility results of the optical position marks of FIGS. 10, 12, 13, 14, 15, 16 and 17 for each optical alignment sensor in the lithography system. Reproducibility is an important performance indicator in position or alignment measurements. For each of the five wafers WFR1,WFR2,WFR3,WFR4,WFR5 (each having the earlier described different masking layer stack) the reproducibility has been measured. The reproducibility was measured as follows. For each wafer the position of the optical position marks were measured at 5 different locations on the wafer, and this measurement was repeated 30 times and this was repeated for both the first optical alignment sensor SS as well as the second optical alignment sensor DS. The bars in FIG. 18 denote the average reproducibility over all 5 locations (or fields). The error bars give the range between the best and worst reproducibility of said 5 locations. What is the most important conclusion from this FIG. 18 is that the segmented marks show a systematically better reproducibility.

Figure 19:
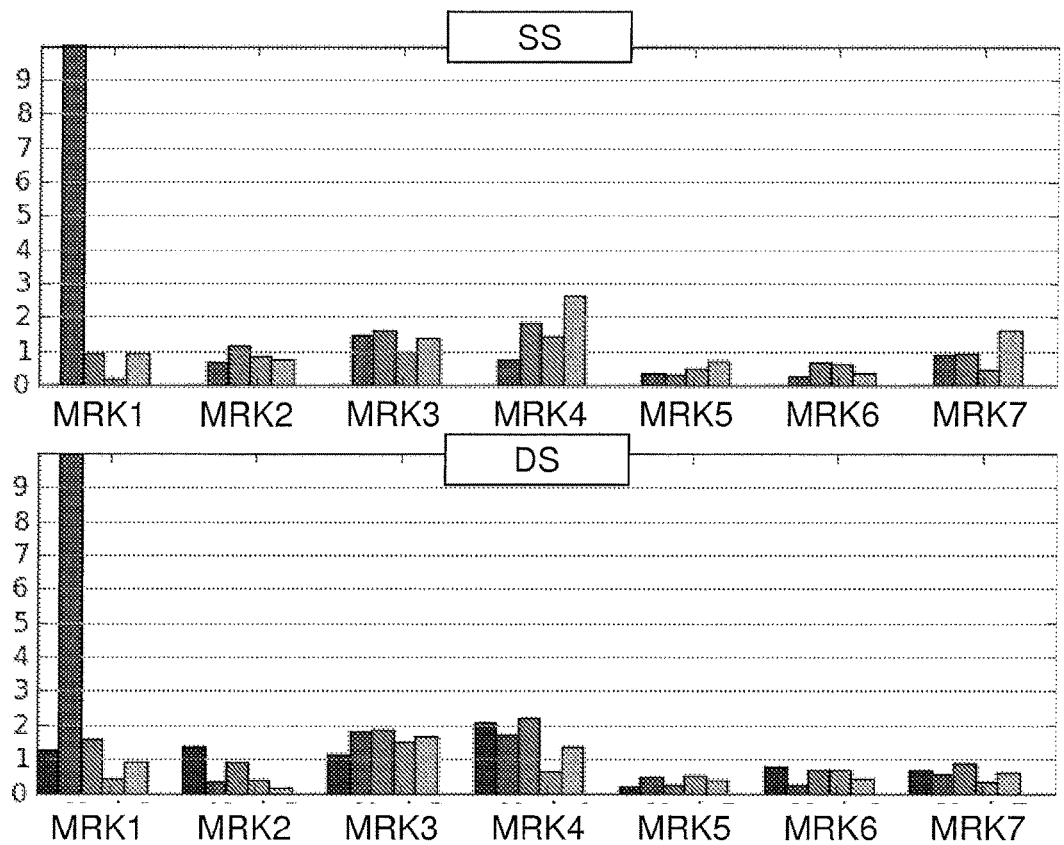
FIG. 19 shows accuracy results of the optical position marks of FIGS. 10, 12, 13, 14, 15, 16 and 17 for each optical alignment sensor in the lithography system.

FIG. 19 shows accuracy results of the optical position marks of FIGS. 10, 12, 13, 14, 15, 16 and 17 for each optical alignment sensor in the lithography system. In the experiments each optical position mark was laid out three in a row. In the accuracy measurements an average offset mark with respect to the outer marks is calculated per wafer per field average. FIG. 19 shows the average (absolute) offset of 5 fields. The results are shown per wafer per mark type. Furthermore, these experiments have been done for both the first optical alignment sensor SS as well as the second optical alignment sensor DS. An important conclusion from FIG. 19 is that the segmented marks show systematically better accuracy.

The invention relates in general to method of determining a position of a substrate in a lithography system, to such substrates as such, and to such lithography system as such. The invention may be applied in various application areas, such as:

optical position marks on substrates for aligning substrate;
optical position marks on substrate carriers for aligning substrate carriers;
optical position marks on chucks for aligning chucks;
optical position marks on masks;
optical position marks on auxiliary substrates, such as beam measurement substrates in E-beam machines.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In addition, it is to be understood that, when in the above description and in the appended claims the phrase "a plurality of times" is used, this is meant to encompass two times or more.

The invention claimed is:

1. A system for determining a position of a substrate in a lithography system, the system comprising:
an optical column adapted for projecting one or more exposure beams onto a substrate;
a first optical alignment sensor mounted to the system such that it has a substantially constant distance from the optical column, the first optical alignment sensor being configured for emitting a light beam to the substrate, the emitted light beam having a predetermined wavelength, and the first optical alignment sensor being further configured for measuring an intensity profile of a zero-th order reflected light beam;
a focusing lens adapted to focus the light beam to a spot having a spot size on the substrate;
the substrate comprising a first optical position mark having a mark height, a mark length and a predetermined known position on the substrate, the first optical position mark extending longitudinally in a first direction and being arranged for varying a reflection coefficient of the first optical position mark along said first direction, wherein the first optical position mark comprises:
a first main region comprising a plurality of first region pairs, the first region pairs being substantially equal to one another;
wherein each first region pair of the first main region comprises:
a first region having a first reflection coefficient and a first width in the first direction; and
a second region having a second reflection coefficient and a second width in the first direction, the second reflection coefficient being different from the first reflection coefficient, the second region neighboring the first region;
wherein said first width is in the same order of magnitude as said spot size;
wherein said second width is in the same order of magnitude as said spot size;
wherein the first region comprises sub-wavelength structures in comparison with a wavelength of the predetermined wavelength of the emitted light beam;
wherein the sub-wavelength structures comprise a plurality of regular segments formed by segmentation of the first region along the first direction and/or a second direction, the second direction being perpendicular to the first direction; and
wherein the system is configured for scanning the first optical alignment sensor over the first optical position mark in the first direction.

2. The system as claimed in claim 1, wherein the first optical position mark further comprises a second main region neighboring the first main region, wherein the second main region is substantially free of structures.

3. The system as claimed in claim 2, wherein the first optical position mark further comprises a third main region neighboring the second main region, wherein the second main region is embedded between the first main region and the third main region when viewed in the first direction, and wherein the third main region comprises a third region pair;
wherein the third region pair of the third main region comprises:
a third region having a third reflection coefficient and a third width; and
a fourth region having a fourth reflection coefficient and a fourth width, the fourth reflection coefficient being different from the third reflection coefficient, the fourth region neighboring the third region;
wherein the third region comprises sub-wavelength structures in comparison with a wavelength of the predetermined wavelength of the emitted light beam.

4. The system as claimed in claim 3, wherein the first main region and the third main region are substantially identical.

5. The system as claimed in claim 1, wherein the first optical position mark further comprises a first end region located at a first end of the first optical position mark neighboring the first main region, the first end region being substantially free of structures.

6. The system as claimed in claim 3, wherein the first optical position mark further comprises a second end region located at a second end of the first optical position mark neighboring the third main region, the second end region being substantially free of structures.

7. The system as claimed in claim 1, wherein the mark height is a plurality of times the wavelength of red or infra-red light.

8. The system as claimed in claim 1, wherein the first width and the second width are in a range between 1 µm and 2 µm.

9. The system as claimed in claim 1, further comprising:
a second optical alignment sensor mounted to the system at a substantially constant distance from the optical column, the second optical alignment sensor being configured for emitting a second light beam to the substrate, the second emitted light beam having a predetermined wavelength, and for measuring an intensity profile of a zero-th order reflected light beam, the system being configured for scanning the second optical alignment sensor in a second direction orthogonal to the first direction.

10. The system as claimed in claim 9, wherein the first alignment sensor is mounted at a fixed and known position with respect to the optical column in said first direction, and the second alignment sensor is mounted at a fixed and known position with respect to the optical column in said second direction.

11. The system as claimed in claim 9, wherein the first and second optical alignment sensors are each dedicated to measuring in one direction only.

12. The system as claimed in claim 9, wherein the substrate further comprises a second optical position mark having a mark height, a mark length and a predetermined known position on the substrate, the second optical position mark extending longitudinally in said second direction and being arranged for varying a reflection coefficient of the second optical position mark along said second direction, wherein the second optical position mark has a structure the same as the first optical position mark.

13. The system as claimed in claim 12, wherein the first optical alignment sensor is displaced in said first direction with respect to projection optics and is arranged for measuring the first optical position mark in said first direction, and the second optical alignment sensor is displaced in said second direction with respect to the projection optics and is arranged for measuring the second optical position mark in said second direction.

14. The system as claimed in claim 10, wherein the first direction coincides with a first movement direction of the substrate in operational use of the lithography system, and the second direction coincides with a second movement direction of the substrate in operational use of the lithography system.

15. The system as claimed in claim 1, wherein the optical column is configured for projecting a multitude of charged particle exposure beams onto the substrate.

16. The system as claimed in claim 1, wherein the system is configured to:
move the substrate such that the first optical position mark is substantially near the first optical alignment sensor in accordance with an estimated position of the first optical position mark with regards to the first optical alignment sensor;
scan the first optical position mark along a scan path in the first direction with the first optical alignment sensor to obtain a measured intensity profile having a scan length, wherein the scan length is longer than the mark length; and
compare the measured intensity profile with an expected intensity profile associated with the first optical position mark to determine a difference between an actual position of the optical position mark and the estimated position; and
determine the actual position of the first optical position mark from the difference.

17. The system as claimed in claim 16, wherein the system is configured to compare the measured intensity profile with the expected intensity profile of the first optical position mark by calculating a cross-correlation function between the measured and expected intensity profiles, and determine a location of a maximum in the cross-correlation function, wherein the location is indicative for said difference.

18. The system as claimed in claim 12, wherein the system in configured to:
move the substrate such that the first optical position mark is substantially near the first optical alignment sensor in accordance with an estimated position of the first optical position mark with regards to the first optical alignment sensor;
scan the first optical position mark along a scan path in the first direction with the first optical alignment sensor to obtain a measured intensity profile having a scan length, wherein the scan length is longer than the mark length; and
compare the measured intensity profile with an expected intensity profile associated with the first optical position mark to determine a first difference between an actual position of the first optical position mark and the estimated position of the first optical position mark;
determine the actual position of the first optical position mark from the first difference;
move the substrate such that the second optical position mark is substantially near the second optical alignment sensor in accordance with an estimated position of the second optical position mark with regards to the second optical alignment sensor;
scan the second optical position mark along a scan path in the second direction with the second optical alignment sensor to obtain a measured intensity profile having a scan length, wherein the scan length is longer than the mark length; and
compare the measured intensity profile with an expected intensity profile associated with the second optical position mark to determine a second difference between an actual position of the second optical position mark and the estimated position of the second optical position mark; and
determine the actual position of the second optical position mark from the second difference.

19. The system as claimed in claim 18, wherein the system is configured to compare the measured intensity profiles with the expected intensity profiles by calculating a cross-correlation function between the measured and expected intensity profiles of the first and second optical position marks, and determine a location of a maximum in the cross-correlation function.

20. The system as claimed in claim 1, wherein said emitted light beam is a polarized light beam, and wherein said first optical alignment sensor comprises a polarizing beam splitter arranged for guiding said emitted light beam toward the substrate and for guiding said reflected light beam toward a light intensity detector, and a quarter wave plate arranged between said polarizing beam splitter and the substrate,
wherein said first optical alignment sensor further comprises the focusing lens arranged between the quarter wave plate and the substrate.

21. A substrate comprising a first optical position mark adapted to cause a variation in intensity of a zero-th order reflection when a light beam focused to a spot is received on the substrate and scanned over the first optical position mark along a first direction, wherein the light beam has light of a predetermined wavelength, and is focused to a spot having a beam spot size on the substrate, the first optical position mark having a mark height, a mark length and a predetermined known position on the substrate, the first optical position mark extending longitudinally in the first direction and having a varying reflection coefficient along said first direction, wherein the first optical position mark comprises a first main region comprising a plurality of region pairs, the region pairs being substantially equal to one another, wherein each region pair comprises:

a first region having a first reflection coefficient and a first width in the first direction, and a second region having a second reflection coefficient and a second width in the first direction, the second reflection coefficient being different from the first reflection coefficient, the second region neighboring the first region, the first region and the second region forming a region pair;

wherein said first width is in the same order of magnitude as said spot size;

wherein said second width is in the same order of magnitude as said spot size;

wherein each of the first regions comprise sub-wavelength structures, in comparison with the predetermined wavelength; and wherein the sub-wavelength structures comprise a plurality of regular segments formed by segmentation of the first region along the first and/or a second direction, the second direction being perpendicular to the first direction.

22. The substrate as claimed in claim 21, wherein the first optical position mark further comprises a second main region neighboring the first main region, wherein the second main region is substantially free of structures.

23. The substrate as claimed in claim 22, wherein the first optical position mark further comprises a third main region neighboring the second main region, wherein the second main region is embedded between the first main region and the third main region when viewed in the first direction wherein the third main region comprises a third region pair;

wherein the third region pair of the third main region comprises:

a third region having a third reflection coefficient and a third width; and a fourth region having a fourth reflection coefficient and a fourth width, the fourth reflection coefficient being different from the third reflection coefficient, the fourth region neighboring the third region;

wherein the third region comprises sub-wavelength structures in comparison with a wavelength of the predetermined wavelength of the emitted light beam.

24. The substrate as claimed in claim 21, wherein the first optical position mark further comprises a first end region located at a first end of the first optical position mark neighboring the first main region, the first end region being substantially free of structures.

25. The substrate as claimed in claim 23, wherein the first optical position mark further comprises a second end region located at a second end of the first optical position mark neighboring the third main region, the second end region being substantially free of structures.

26. The substrate as claimed in claim 21, wherein the mark height is smaller than 40 µm and wherein the mark length is at least 100 µm.

27. The substrate as claimed in claim 21, wherein the first width and the second width are in a range between 1 µm and 2 µm.

28. The substrate as claimed in claim 21, wherein the substrate further comprises a second optical position mark having a mark height, a mark length and a predetermined known position on the substrate, the second optical position mark extending longitudinally in said second direction and having a varying reflection coefficient along said second direction, wherein the second optical position mark has a structure the same as the first optical position mark.

* * * * *